US011662665B2

United States Patent
Lee et al.

(10) Patent No.: US 11,662,665 B2
(45) Date of Patent: *May 30, 2023

(54) LITHOGRAPHY METHOD USING MULTISCALE SIMULATION, AND METHOD OF MANUFACTURING SEMICONDUCTOR DEVICE AND EXPOSURE EQUIPMENT BASED ON THE LITHOGRAPHY METHOD

(71) Applicant: Samsung Electronics Co., Ltd., Suwon-si (KR)

(72) Inventors: Byunghoon Lee, Seoul (KR); Maenghyo Cho, Seoul (KR); Changyoung Jeong, Yongin-si (KR); Muyoung Kim, Seoul (KR); Junghwan Moon, Seoul (KR); Sungwoo Park, Seoul (KR); Hyungwoo Lee, Seoul (KR)

(73) Assignees: Samsung Electronics Co., Ltd., Gyeonggi-do (KR); Seoul National University R&DB Foundation, Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/672,937

(22) Filed: Feb. 16, 2022

(65) Prior Publication Data

US 2022/0350256 A1 Nov. 3, 2022

(30) Foreign Application Priority Data

Apr. 30, 2021 (KR) .......................... 10-2021-0056221

(51) Int. Cl.
*G03F 7/20* (2006.01)
*H01L 21/027* (2006.01)
(Continued)

(52) U.S. Cl.
CPC ................ *G03F 7/705* (2013.01); *G03F 7/40* (2013.01); *G03F 7/70033* (2013.01);
(Continued)

(58) Field of Classification Search
CPC ........ G03F 7/40; G03F 7/70033; G03F 7/705; G03F 7/70608; G03F 7/0045;
(Continued)

(56) References Cited

U.S. PATENT DOCUMENTS 7,921,383 B1 * 4/2011 Wei .......................... G03F 7/705
716/54
8,910,093 B2 12/2014 Flagello
(Continued)

FOREIGN PATENT DOCUMENTS

JP 6711201 B2 6/2017
KR 10-2019-0033912 A 4/2019

OTHER PUBLICATIONS

H. Lee et al. 'Multiscale simulation of extreme ultraviolet nanolithography: impact of acid-base reaction on pattern roughness' *Journals of Materials Chemistry C*, 2021, 9, pp. 1183-1195.
R. Lawson et al. 'Mesoscale simulation of molecular resists: The effect of PAG distribution homogeneity on LER' *Microelectronic Engineering*, 2009, 86, pp. 741-744.
(Continued)

*Primary Examiner* — Deoram Persaud
(74) *Attorney, Agent, or Firm* — Harness, Dickey & Pierce, P.L.C.

(57) ABSTRACT

A lithography method using a multiscale simulation includes estimating a shape of a virtual resist pattern for a selected resist based on a multiscale simulation; forming a test resist pattern by performing an exposure process on a layer formed of the selected resist; determining whether an error range between the test resist pattern and the virtual resist pattern is in an allowable range; and forming a resist pattern on a
(Continued)

patterning object using the selected resist when the error range is in the allowable range. The multiscale simulation may use molecular scale simulation, quantum scale simulation, and a continuum scale simulation, and may model a unit lattice cell of the resist by mixing polymer chains, a photo-acid generator (PAG), and a quencher.

20 Claims, 20 Drawing Sheets

(51) Int. Cl.
*G03F 7/40* (2006.01)
*G05B 19/4099* (2006.01)
*G06F 30/25* (2020.01)

(52) U.S. Cl.
CPC ..... *G03F 7/70608* (2013.01); *G05B 19/4099* (2013.01); *G06F 30/25* (2020.01); *H01L 21/0274* (2013.01); *G05B 2219/45031* (2013.01)

(58) Field of Classification Search
CPC ...... G05B 19/4099; G05B 2219/45031; G06F 30/25; H01L 21/0274
See application file for complete search history.

(56) References Cited

U.S. PATENT DOCUMENTS

| | | | |
|---|---|---|---|
| 9,679,116 | B2 | 6/2017 | Biafore et al. |
| 9,733,576 | B2* | 8/2017 | Smith ................... G03F 7/0392 |
| 10,007,191 | B2 | 6/2018 | Biafore et al. |
| 10,048,594 | B2* | 8/2018 | Carcasi ................. G03F 7/2004 |
| 10,429,745 | B2 | 10/2019 | Caroasi et al. |
| 10,545,411 | B2* | 1/2020 | Hansen ................. G06F 30/398 |
| 11,493,850 | B2* | 11/2022 | Lee ..................... G03F 7/70516 |
| 2011/0112809 | A1* | 5/2011 | Biafore ................. G03F 7/0045 703/2 |
| 2016/0012175 | A1* | 1/2016 | Wu ....................... G03F 7/0045 716/52 |
| 2018/0052979 | A1 | 2/2018 | Bito et al. |
| 2020/0057371 | A1 | 2/2020 | Nagahara |
| 2020/0124973 | A1* | 4/2020 | Liu ..................... H01L 21/0274 |
| 2021/0026249 | A1* | 1/2021 | Lee ..................... G03F 7/70516 |

OTHER PUBLICATIONS

F. Houle et al. 'Kinetic Model for Positive Tone Resist Dissolution and Roughening' *Macromolecules*, 2002, 35, pp. 8591-8600.

Kim et al., "Multiscale Simulation Approach on Sub-10 nm Extreme Ultraviolet Photoresist Patterning: Insights from Nanoscale Heterogeneity of Polymer," Macromolecules, v. 51, No. 17, p. 6922-6935, Sep. 2018.

* cited by examiner (a) (b)

t = 0.006s (a) (b)

t = 0.0072s (a) (b)

t = 0.3s (a) (b)

t = 0.81s t = 5.4s

LITHOGRAPHY METHOD USING MULTISCALE SIMULATION, AND METHOD OF MANUFACTURING SEMICONDUCTOR DEVICE AND EXPOSURE EQUIPMENT BASED ON THE LITHOGRAPHY METHOD

CROSS-REFERENCE TO RELATED APPLICATION(S)

This application claims benefit of priority to Korean Patent Application No. 10-2021-0056221 filed on Apr. 30, 2021 in the Korean Intellectual Property Office, the disclosure of which is incorporated herein by reference in its entirety.

BACKGROUND

The present disclosure relates to a lithography method, and more particularly, to a lithography method using a simulation, and a method of manufacturing a semiconductor device and exposure equipment based on the lithography method.

Recently, as the width of semiconductor circuit lines becomes finer, a light source having a shorter wavelength is required for photolithography processes. For example, extreme ultraviolet (EUV) is commonly used as an exposure light source. Due to absorption characteristics of EUV, a reflective EUV mask is commonly used in an EUV exposure process. In addition, illumination optics for transmitting EUV to the EUV mask and projection optics for projecting EUV reflected from the EUV mask to an object to be exposed may each include a plurality of mirrors. As a level of difficulty of the exposure process gradually increases, the significance of development of the EUV resist used in a lithography process is also increasing.

SUMMARY

Example embodiments provide a lithography method of selecting an optimal resist, and a method of manufacturing a semiconductor device and exposure equipment based on the lithography method.

According to some example embodiments, a lithography method may include: estimating a shape of a virtual resist pattern for a selected resist based on a multiscale simulation; forming a test resist pattern by performing an exposure process on a layer formed of the selected resist; determining whether an error range between the test resist pattern and the virtual resist pattern is in an allowable range; and forming a resist pattern on a patterning object using the selected resist when the error range is in the allowable range. The estimating of the virtual resist pattern may include: selecting a material composition for the selected resist; modeling a unit lattice cell of the selected resist using a molecular scale simulation; calculating a dissociation energy curve of a photo-acid generator (PAG) for the material composition, a reaction rate constant of an acid-base neutralization reaction, and a reaction rate constant of deprotection of a molecular chain included in the material composition using a quantum scale simulation; simulating the acid-base neutralization reaction, acid/base diffusion, and deprotection of the molecular chain using a continuum scale simulation; calculating solubility of the molecular chain after the deprotection; forming the virtual resist pattern by stabilizing a pattern formed after a soluble molecular chain is removed from the unit lattice cell; estimating the shape of the virtual resist pattern; and calculating a numerical value for the shape of the virtual resist pattern.

According to some example embodiments, a method of manufacturing a semiconductor device may include: estimating a shape of a virtual resist pattern for a selected resist based on a multiscale simulation; forming a test resist pattern by performing an exposure process on a layer formed of the selected resist; determining whether an error range between the test resist pattern and the virtual resist pattern is in an allowable range; forming a resist pattern on a patterning object using the selected resist pattern when the error range between the test resist pattern and the virtual resist pattern is in the allowable range; forming a pattern by etching the patterning object using the resist pattern as an etching mask; and performing a subsequent semiconductor process after the pattern is formed. The estimating of the virtual resist pattern may include: selecting a material composition for the selected resist; modeling a unit lattice cell of the selected resist using a molecular scale simulation; calculating a dissociation energy curve of a photo-acid generator (PAG) for the material composition, a reaction rate constant of an acid-base neutralization reaction, and a reaction rate constant of deprotection of a molecular chain included in the material composition using a quantum scale simulation; simulating an acid-base neutralization reaction, acid/base diffusion, and deprotection of the molecular chain using a continuum scale simulation; calculating solubility of the molecular chain after the deprotection; forming the virtual resist pattern by stabilizing a pattern, formed after a soluble molecular chain is removed from the unit lattice cell; estimating the shape of the virtual resist pattern; and calculating a numerical value for the shape of the virtual resist pattern.

According to some example embodiments, exposure equipment may include: a simulation device including processing circuitry configured to estimate a shape of a virtual resist pattern of a selected resist by performing a quantum scale simulation based on a dissociation energy curve of a photo-acid generator (PAG) of the selected resist, a reaction rate constant of an acid-base neutralization reaction of the selected resist, and a reaction rate constant of deprotection of a molecular chain included in the selected resist, performing a molecular scale simulation based on a unit lattice cell of the selected resist, the unit lattice modeled, at a molecular level, based on a mixture including a molecular chain, the PAG, and a quencher, and performing a continuum scale simulation of an acid-base neutralization reaction, acid/base diffusion, and deprotection reaction; an exposure device configured to perform an exposure process to form a test resist pattern based on a result from the simulation device; and a measurement device configured to measure the test resist pattern and to compare the test resist pattern with the virtual resist pattern.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

Figure 1:
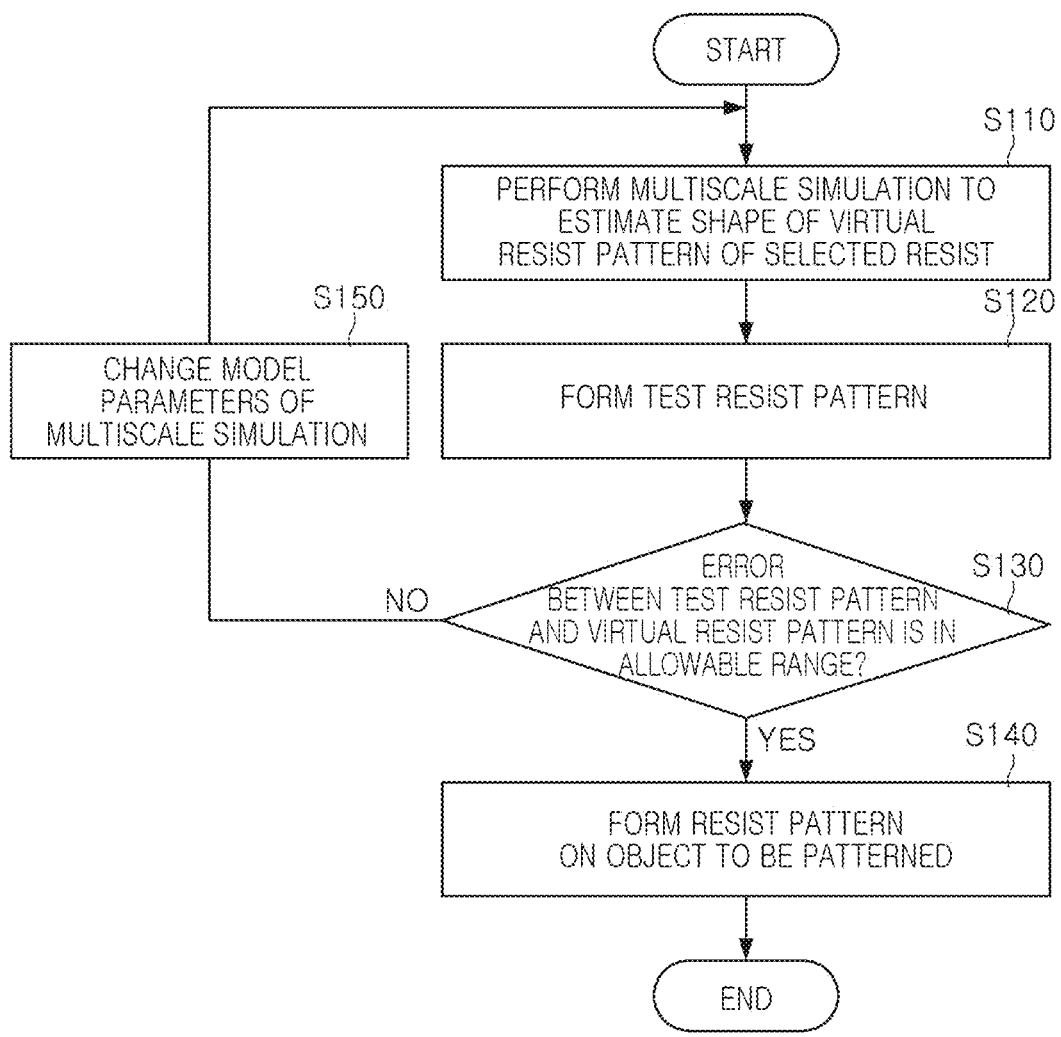
FIG. 1 is a schematic flowchart illustrating a lithography method using a multiscale simulation according to some example embodiments.

FIG. 1 is a schematic flowchart illustrating a lithography method using a multiscale simulation according to some example embodiments.

Referring to FIG. 1, a lithography method using multiscale simulation according to the example embodiment (hereinafter simply referred to as "lithography method") may start with operation S110 of estimating a shape of a virtual resist pattern based on a multiscale simulation. The multiscale simulation may be a simulation in which simulations of different scales are organically integrated with each other. For example, in the multiscale simulation, a quantum scale simulation, a molecular scale simulation, and/or a continuum scale simulation may be organically integrated with each other. In the multiscale simulation, a result of the quantum scale simulation may be used for the molecular scale simulation and/or the continuum scale simulation, a result of the molecular scale simulation may be used for the continuum scale simulation, and a result of the continuum scale simulation may be used for the molecular scale simulation and accordingly, the simulations may be organically connected to each other.

The quantum scale simulation may be a simulation and/or modeling of a chemical reaction accompanying a change in electronic structure. For example, the quantum scale simulation may include simulations of dissociation energy of a photo-acid generator (PAG) by a secondary electron, a reaction rate constant of an acid-base neutralization reaction, a reaction rate constant of deprotection, and/or the like. The molecular scale simulation may be a simulation on an atomic and/or molecular level. For example, the molecular scale simulation may include a simulation for modeling a unit lattice cell on the molecular level, a simulation for detecting a combination structure between a polymer chain and a PAG in a unit lattice cell, and/or a simulation for detecting a protection group position, an acid concentration profile, and/or a quencher concentration distribution.

The continuum scale simulation may be a simulation for and/or modeling of physical and/or chemical phenomena accompanying a continuous change in material properties in time and space. For example, the continuum scale simulation may include a simulation for acid/base diffusion, a simulation for an acid-base neutralization reaction, and/or a simulation for a deprotection reaction. The term "continuum" refers to a material having characteristics maintained overall even when the material is infinitely divided into small elements. In such a continuum concept, it may be ignored that the material is not continuous, is formed of atoms, and/or has a non-uniform microstructure.

In some embodiments, during the operation S110, the virtual resist pattern may be formed while changing model parameters for resist using the multiscale simulation, and/or a shape of a corresponding virtual resist pattern may be estimated. In operation S110, the simulation may be repeated until the shape of the virtual resist pattern reaches a shape of a required object resist pattern.

Example embodiments of operation S110 will be described in more detail with reference to FIG. 3A.

The lithography method according to the present embodiment may include all types of lithography processes including an exposure process. For example, the lithography method according to the present embodiment may include an extreme ultraviolet (EUV) lithography method, an ArF-Immersion lithography method, an ArF lithography method, a KrF lithography method, an electron beam lithography method, an ion-beam lithography method, and/or a neutron beam lithography method. Hereinafter, for ease of description, the EUV lithography method will be mainly described.

After estimating the shape of the virtual resist pattern, in operation S120, a resist is selected based on a simulation result, and an exposure process is performed on a layer, formed of the selected resist, to form a test resist pattern. The resist may be, for example, an EUV resist and the exposure process may be performed using EUV. However, the resist is not limited to an EUV resist and the exposure process is not limited to an exposure process performed using EUV. A process of forming the test resist pattern may be the same as a subsequent process of forming a resist pattern on an object to be patterned (hereinafter referred to as a "patterning object), except that the resist pattern is formed on a test substrate.

After forming the test resist pattern, the test resist pattern is compared with the virtual resist pattern and a determination is made as to whether an error is in an allowable range, in operation S130. The test resist pattern may be compared with the virtual resist pattern by comparing various values with each other. For example, a critical dimension (CD), line edge roughness (LER), line width roughness (LWR), and local CD uniformity (LCDU) may be compared with each other. The allowable range may be arbitrarily set by a user in consideration of a process error in an actual lithography process. For example, an error of 10% or less may be set as the allowable range.

When the error is in the allowable range (YES), the lithography method proceeds to operation S140 in which the resist pattern may be formed on the patterning object using the resist. The exposure process may be, for example, an EUV exposure process, and the patterning object (see W of FIG. 11B) may be an object on which a pattern is to be formed later using a resist pattern. For example, the patterning object W may be and/or include a wafer and/or a mask for manufacturing a plurality of semiconductor devices.

Example embodiments of the operation S140 will be described in more detail with reference to FIG. 3B.

When the error is outside of the allowable range (NO), the lithography method proceeds to operation S150 in which the model parameters of the multiscale simulation are changed. The model parameters may be model parameters used for each simulation in the multiscale simulation. For example, the model parameters may be calculation formulas used in each simulation or parameters included in the calculation formulas. As described above, changing the model parameters may result in different result values of the multiscale simulation for the same resist material composition.

After changing the model parameters, the lithography method proceeds to operation S110 of estimating of the shape of the virtual resist pattern, and subsequent operations are performed.

In the lithography method according to the present embodiment, through the multiscale simulation in which the quantum scale, the molecular scale, and/or the continuum scale are integrated, physical phenomena on a multilevel, such as acid activation, acid/base diffusion, an acid-base neutralization reaction and/or a change in concentration of the acid caused by the neutralization reaction, deprotection, a change in solubility of a polymer chain, and/or control of acid diffusion by base in unexposed regions, may be simulated. Therefore, in the lithography method according to the present example embodiments, selection of a structure or a material composition of the resist to patterning of the resist (for example, resist manufacturing or selection→exposure-→post-exposure bake (PEB)→developing) may all be performed together and may significantly reduce development time and costs of lithography resist. In addition, the lithography method according to the present example embodiments may overcome limitations of conventional single-scale simulations by significantly improving the consistency for estimations of resist pattern shapes (e.g., as compared with the single scale simulations).

For reference, in an interpretation method of simulating a lithography process using an individual scale simulation and estimating a resist pattern based on a Kinetic Monte Carlo (KMC) simulation (e.g., a meso scale simulation) a photoresist polymer chain may be replaced with a lattice model and the movements of acid molecules between respective lattice regions are simulated using a random walk algorithm. However, in the KMC interpretation model, a photochemical reaction such as exposure→PAG dissociation→acid activation may not be precisely simulated. Moreover, since an amorphous polymer chain is replaced with a cubic structure, a pattern shape of several nanometers may not be precisely estimated.

In addition, in an interpretation model based on a finite difference method (FDM) simulation (e.g., a continuum scale simulation) a photoresist is replaced with a volume element array, and then chemical reaction progresses in the respective elements are calculated using an Arrhenius equation. However, the FDM interpretation model may suffer from fundamental limitations such as requirement for preceding experimental data to apply a chemical reaction rate constant in the Arrhenius equation and impossibility to simulate a photochemical reaction such as exposure→PAG dissociation→acid activation, the beginning of the chemical reaction. In addition, after the photochemical reaction, a polymer chain may not be removed the pattern shape may not be estimated by a development process, which is significantly problematic.

Meanwhile, in the lithography method according to the present embodiment, physical phenomena on a multilevel, such as acid activation, acid/base diffusion, an acid-base neutralization reaction, a change in concentration of acid caused by the neutralization reaction, deprotection, and/or a change in solubility of a polymer chain may be simulated together in a resist including a 3-component system through a multiscale simulation. Thus, the limitations of the conventional single scale simulations may be overcome to significantly improve consistency for the estimation of the resist pattern shape, as compared with the single scale simulations.

Figure 2:
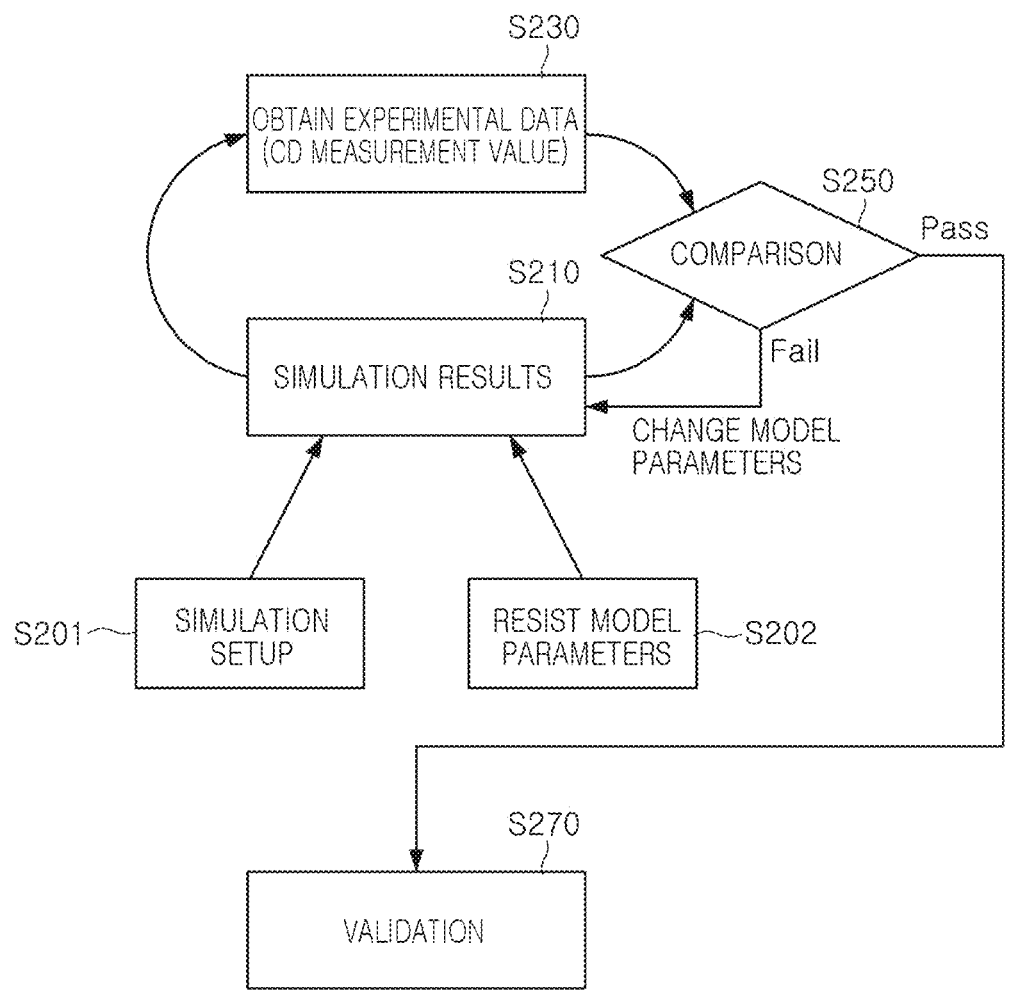
FIG. 2 is a conceptual diagram for describing the lithography method of FIG. 1 in term of a comparison between experimental data and a simulation result.

FIG. 2 is a conceptual diagram for describing the lithography method of FIG. 1 in term of a comparison between experimental data and a simulation result. The description previously provided with reference to FIG. 1 will be simplified or omitted.

Referring to FIG. 2, in the lithography method according to the present example embodiments, in operation S210, a resist is selected based on a simulation result. For example, the resist may be selected using a multiscale simulation. For a multiscale simulation, operation S201 of integrating simulations of different scales through simulation setup and operation S202 of setting model parameters for a resist to be used in the multiscale simulation may be performed in advance.

In operation S230, an exposure process is performed using the selected resist to form a resist pattern, and experimental data on the resist pattern is obtained. The experimental data may be, for example, CD measurement values for the resist pattern. However, the experimental data are not limited to CD measurements on the resist patterns.

In operation S250, the experimental data is compared with data on a virtual resist pattern estimated through the multiscale simulation. When an error (e.g., a difference between the experimental data and simulation results and/or the deviations in the CD measurement values) is in an allowable range (e.g., are within operation tolerances) through the comparison (PASS), the resist selection based on the multiscale simulation is verified as valid, in operation S270. The data on the virtual resist pattern may be similar to data on a desired object resist pattern.

On the other hand, when the error is outside of the allowable range through the comparison (FAIL), model parameters in the multiscale simulation are changed, and the operation of selecting a resist using the multiscale simulation is performed again.

For reference, since most developments of a conventional resist are selected based on an experimental test (for example, resist manufacturing→exposure→PEB→developing→scanning electron microscopy (SEM) measuring), too long a development period and/or too high costs may be required. In addition, in a conventional simulation method, since a large amount of random parameter may be included in a portion in which resist is patterned, a simulation of a simple equation is used, and the simulation is interlocked with a semi-empirical model including an experimental scanning electron microscopy (SEM) image, a development period may be long and/or the consistency of estimation of the shape of the resist pattern is not high.

On the other hand, in the lithography method according to the present example embodiments, a structure and concentration of a resist material (for example, a polymer chain, a PAG, a quencher, a surfactant, or the like) may be optimized using a multiscale simulation interlocked between different scales, and characteristics (for example, CD, LER, LWR, LCDU, and the like) of the resist pattern may be calculated after simulation of PEB and/or a development process. Thus, prescreening may be performed before an experimental test, and/or the resist developing time and costs may be significantly reduced by securing consistency for a resist development solution and significantly reducing tests through integration of the experimental test with the multiscale simulation. Furthermore, in the lithography method according to the present example embodiments, use of a random parameter may be significantly reduced and the parameter may be calculated in association with the other scale parameters, based on the multiscale simulation. Thus, reliability of a calculation result may be secured and, distortion of an SEM noise level may be significantly reduced, thereby significantly improving consistency of a 3D pattern profile of the resist.

Figure 3A:
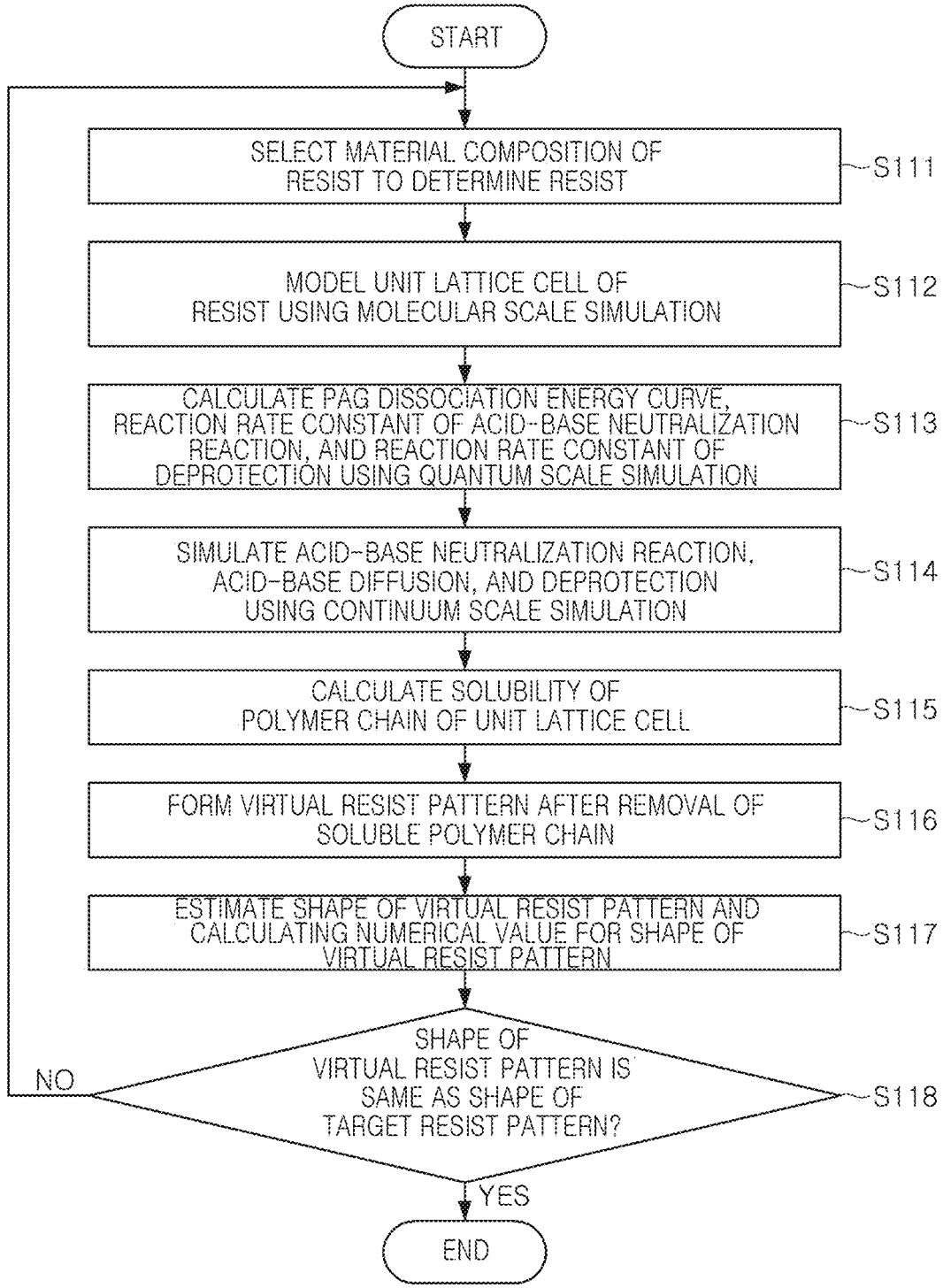
FIG. 3A is a flowchart illustrating an operation of predicting a shape of a virtual resist pattern of FIG. 1.
Figure 3B:
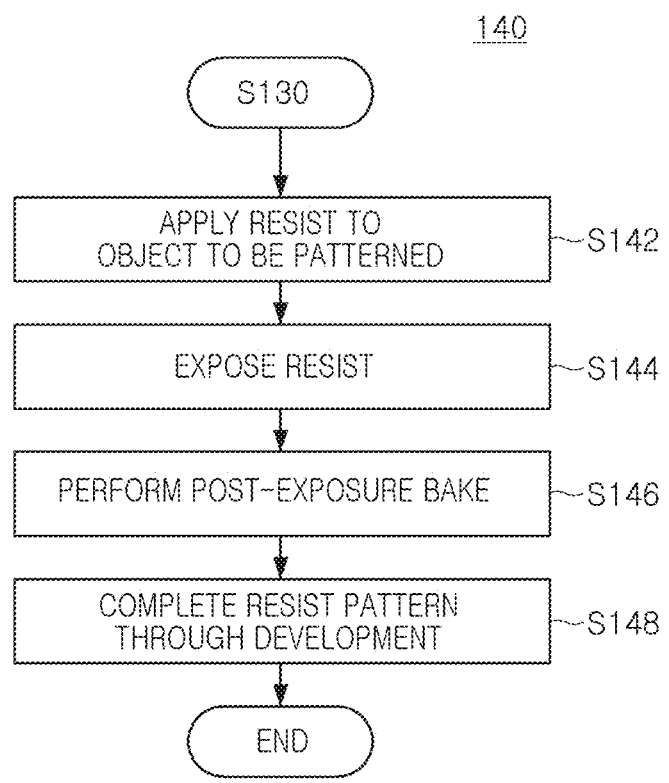
FIG. 3B is a flowchart illustrating an operation of forming a resist pattern of FIG. 1.

FIG. 3A is a flowchart illustrating an operation of predicting a shape of a virtual resist pattern of FIG. 1, and FIG. 3B is a flowchart illustrating an operation of forming a resist pattern of FIG. 1. The descriptions previously provided with reference to FIGS. 1 and 2 will be simplified or omitted.

Referring to FIG. 3A, operation S110 of estimating the shape of the virtual resist pattern S110 includes operation S111 in which a material composition of a resist to be simulated is selected to determine a resist. For example, the material composition of the resist may include a molecular weight of a polymer chain, a kind of a protection group of the polymer chain, a kind and a mixing ratio of PAG molecules, a kind and a mixing ratio of a quencher, a kind and mixing ratio of other resist material, and/or the like. However, the material composition of the resist is not limited to the above examples.

In operation S112, a unit lattice cell of the selected resist is modeled using a molecular scale simulation. The molecular scale simulation may be, for example, a molecular dynamics (MD) simulation. The unit lattice cell may be modeled by mixing a polymer chain, a PAG, and/or a quencher. The unit lattice cell may further other components such as a surfactant. A unit lattice cell of a resist may be modeled from a system including at least three kinds of component.

A corresponding unit lattice cell may be stabilized by applying a conjugate gradient method, and then may reach an equilibrium state under a corresponding process condition.

In operation S113, a PAG dissociation energy curve, a reaction rate constant of an acid-base neutralization reaction, a reaction rate constant of deprotection are calculated using a quantum scale simulation. The quantum scale simulation may be, for example, a density function theory (DFT) simulation. The PAG dissociation energy curve in accordance with secondary electron absorption occurring in exposure may be calculated by stabilizing a molecular structure.

The dissociation energy curve of the PGA may be applied to a force field between PAG cations and anions in an exposed region of the lattice unit cell (e.g., modeled by the molecular scale simulation), and may be reproduced as a dissociation reaction of the PAG in an exposed region in an NPT ensemble. Accordingly, in operation S112 of modeling the unit lattice cell of the selected resist, the PAG dissociation energy curve may be used to simulate the PAG dissociation reaction and/or to obtain acid concentration distribution information. In some embodiments, the reaction rate constant of the acid-base neutralization reaction may be calculated under an assumption that the same amount of acid and base are neutralized to disappear through the acid-base neutralization reaction as soon as the acid and the base react with each other. The reaction rate constant of the acid-base neutralization reaction may be used to simulate the acid-base neutralization reaction in a continuum scale simulation.

The reaction rate constant of deprotection may be calculated by applying, for example, energy and a vibrational frequency of main molecules (for example, a protection group and an acid molecule) to a transition state theory. For example, the reaction rate constant of deprotection (e.g., the rate of cleaving and/or removing of the protection group from the main molecule) may be used to simulate the deprotection in the continuum scale simulation.

In operation S114, the acid-base neutralization reaction, the acid-base diffusion, and deprotection are simulated using a continuum scale simulation. The continuum scale simulation may be, for example, a finite difference method (FDM) simulation.

In operation S112 of modeling the unit lattice cell of the selected resist (e.g., through an MD simulation), an acid concentration profile activated from the PAG anions may be quantified and/or positions of the protection group, the acid, and/or the quencher in the unit lattice cell may be calculated. In the continuum scale simulation, a lattice cell of a continuum may be modeled by mapping the positions of the protection group, the acid, and the acid concentration profile from the unit lattice cell of the molecular scale.

In operation S115, solubility of the polymer chain in the unit lattice cell depending on the deprotection is calculated. The solubility of the polymer chain may be calculated for each chain by obtaining an arithmetic mean value of a protection ratio of the protection group incorporated in the polymer chain. When the protection ratio of the polymer chain is less than or equal to a specific reference value, a developing solvent may be set to be soluble.

In operation S116, the soluble polymer chain is removed from the unit lattice cell according to the solubility, and then a virtual resist pattern is formed. The virtual resist pattern may be formed by stabilizing unit lattice cells remaining after removing a polymer chain selected to be soluble from a unit lattice cell.

In operation S117, the shape of the virtual resist pattern is estimated and a numerical value for the shape of the virtual pattern is calculated. The estimation of the shape of the virtual resist pattern may be estimation of a shape and/or a size of the virtual resist pattern. In addition, the numerical value for the shape of the virtual resist pattern may include CD, LER, LWR, and/or LCDU. However, the numerical value for the shape of the virtual resist pattern is not limited thereto. Ability of patterning the resist material selected by calculating the estimation and the numerical value for the shape of the virtual resist pattern may be quantified.

In operation S118, a determination is made as to whether the shape of the virtual resist pattern is the same as and/or within an allowable range of an object resist pattern. When the shape of the virtual resist pattern is the same as and/or within the allowable range of the shape of the object resist pattern (YES), the flow proceeds to operation S120 in which the test resist pattern of FIG. 1 is formed. When the shape of the virtual resist pattern is different from and/or outside the allowable range of the shape of the object resist pattern in the allowable range (NO), the flow returns to operation S111 in which the material composition of the resist is selected, and thus, subsequent operations are repeated.

Referring to FIG. 3B, operation S140 of forming the resist pattern on the patterning object includes operation in which the selected resist is coated on an object to be patterned (hereinafter referred to as a "patterning object") (see W of FIG. 12B). The selected resist may be, for example, an EUV resist. In some example embodiments, the selected resist may be coated on the patterning object W by a spin coating process.

After the resist is applied, the resist is exposed by an exposure device (see 200 of FIG. 11B), in operation S144. The exposure device 200 may be, for example, an EUV exposure device. Chemical characteristics of the resist may be changed through a series of reactions such as PAG dissociation, acid activation and diffusion, an acid-base neutralization reaction, and/or deprotection by an exposure process. Such a process may be simulated through a multi-scale simulation.

In operation S146, a post-exposure-bake (PEB) is performed on the exposed resist. After the PEB process is performed, the resist may be developed by a developing solvent to complete a test resist pattern. In the development process, a soluble polymer chain in the developing solvent may be removed to form a final test resist pattern. The developing solvent may include a polar and/or a non-polar solvent. The solubility of the polymer chain and solubility of the polymer chain in the development solvent in accordance with the solubility of the polymer chain may be determined based on a protection ratio of the protection group. The protection ratio and the solubility of the polymer chain in accordance with the solubility of the polymer chain will be described in more detail with reference to FIGS. 6A to 6F.

Figure 4A:
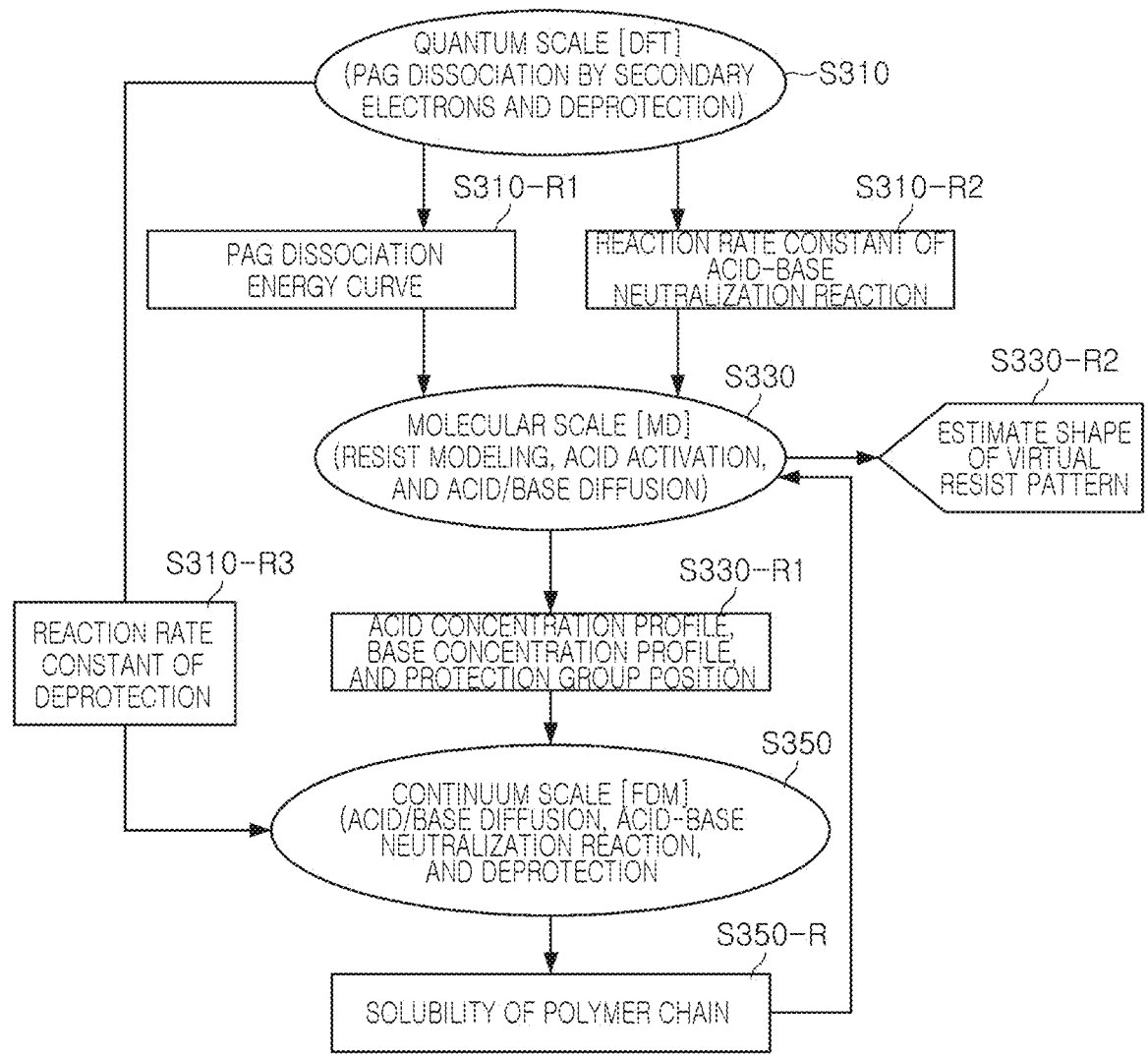
FIGS. 4A and 4B are a flowchart illustrating a correlation between simulations used in an operation of predicting a shape of a virtual resist pattern of FIG. 3B and a graph illustrating a comparison between scales treated in the simulations, respectively.
Figure 4B:
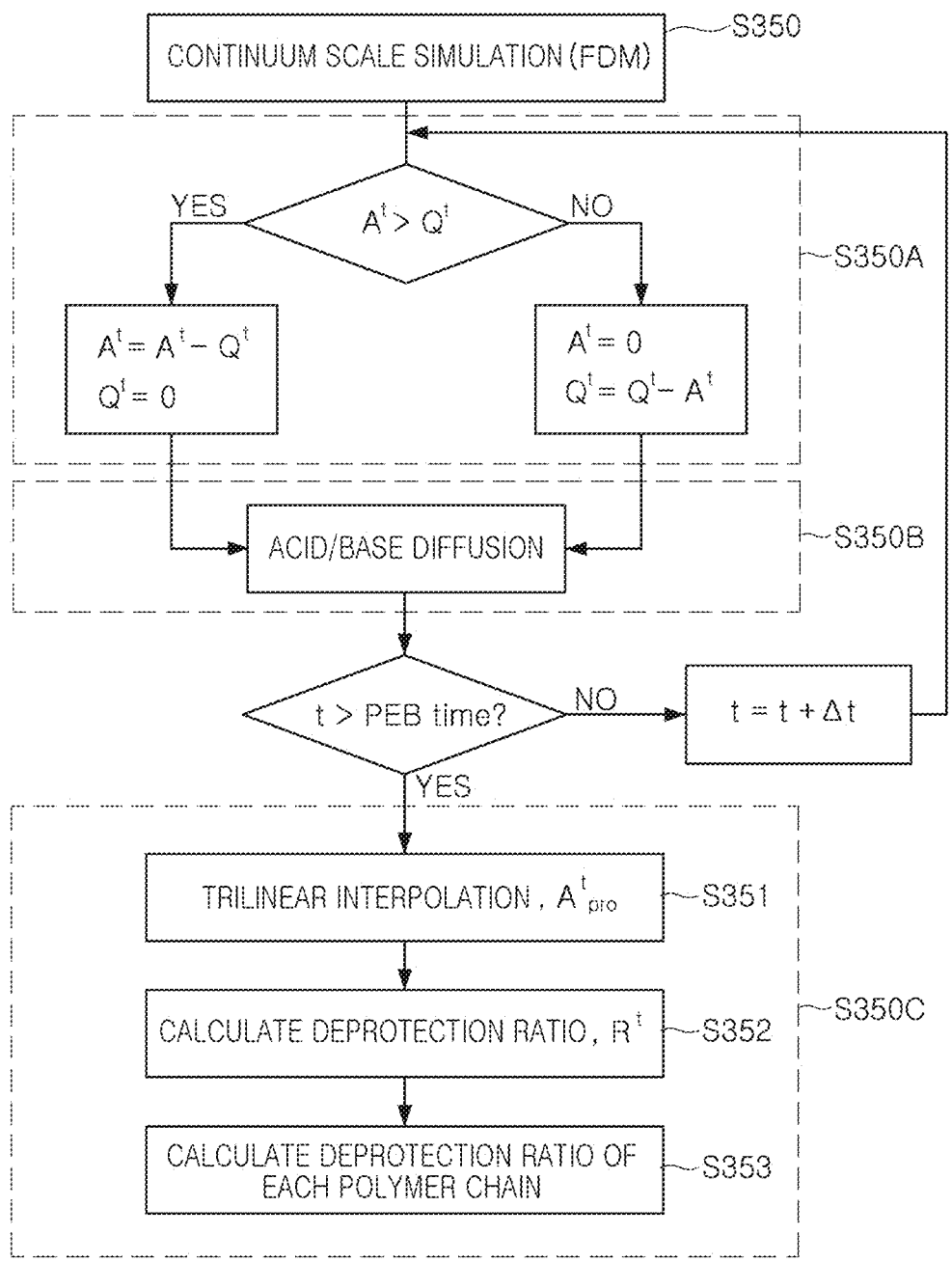

FIGS. 4A and 4B are a flowchart illustrating a correlation between simulations used in an operation of predicting a shape of a virtual resist pattern of FIG. 3B and a graph illustrating a comparison between scales treated in the simulations, respectively. The descriptions previously provided with reference to FIGS. 1 and 2 will be simplified or omitted.

Referring to FIGS. 4A and 4B, a lithography method according to the present embodiment will be described through the respective scale simulation processes.

In a quantum scale simulation operation S310, PAG dissociation caused by the generation of secondary electrons after exposure and an acid-base neutralization reaction are simulated to calculate material properties such as a PAG dissociation energy curve S310-R1 and a reaction rate constant of the acid-base neutralization reaction S310-R2 required in a molecular scale simulation. In addition, a deprotection reaction between the activated acid and a protection group inside a polymer chain may be simulated to calculate physical properties (such as a deprotection reaction rate constant S310-R3 used in a continuum scale simulation). For example, molecular structures of a reactant, a product, and/or a transition state may be estimated using a DFT simulation to calculate physical properties. In addition, while stabilizing each of the molecular structures to calculate a dissociation energy curve of PAG, energy and a vibration frequency in a structure of main molecules may be applied to a transition state to calculate a reaction rate constant of deprotection.

In a molecular scale simulation operation S330, a unit lattice cell of a selected resist is modeled at a molecular level in accordance with a material composition (for example, kinds, amounts, and mixing ratios of a polymer chain, PAG, and/or a quencher), and an acid concentration profile, a base concentration profile, and/or a protection group position S330-R1 used in the continuum scale simulation are calculated. In addition, the soluble polymer chains selected in the continuum scale simulation may be removed to form and stabilize a shape of a final virtual resist pattern. For example, by performing an MD simulation, an amorphous polymer chain having a specific protection ratio, a PAG molecule, and a quencher molecule may be mixed to constitute a unit lattice cell. Then, a dissociation energy curve of the PAG calculated in the quantum scale simulation may be applied to simulate a dissociation reaction of the PAG, and position information of the observed major molecules (for example, the protection group, the acid, and/or the quencher) may be transmitted to the continuum scale simulation.

An initial acid concentration and an initial quencher concentration on each node of a unit lattice cell may be derived as a function in accordance with a distance between the protection group and the PAG anion and a function in accordance with a distance between the PAG anion and the quencher, respectively. Interaction energy $E_{int}$ in accordance with a distance "r" between reactors of respective chemical reactions may be obtained through molecular dynamics calculation, as illustrated in the following equations 1 and 2, and a local concentration of the acid $f_{acid}(r)$ and a concentration of the quencher $f_{quencher}(r)$ may be represented as a difference $\Delta E_{int}$ between Boltzmann activation energy in a chemical reaction and energy in a most stabilized structure to be obtained as illustrated in the following equations 3 and 4. An initial acid concentration concentrated in the exposed region of the unit lattice cell, an initial quencher concentration distributed over the exposed region, and/or an unexposed region may be quantified through the following equations 1 to 4. The initial acid concentration and the initial quencher concentration calculated in such a manner may be applied to A and Q in the following equations 5 and 6, as an initially quantified concentration of a nodal point of each material.

$$E_{int,acid} = E_{all} - E_{PR} - E_{PAG} \qquad \text{Equation 1}$$

$$E_{int,quencher} = E_{all} - E_{PAG} - E_{quencher} \qquad \text{Equation 2}$$

$$f_{acid}(r) = \exp(\Delta E_{int,quencher}(r)/k_B T) \qquad \text{Equation 3}$$

$$f_{quencher}(r) = \exp(\Delta E_{int,quencher}(r)/k_B T) \qquad \text{Equation 4,}$$

where $E_{all}$, $E_{PR}$, $E_{PAG}$, and $E_{quencher}$ may denote energies of an entire system, a polymer chain, a PAG, and a quencher, respectively, $k_B$ may denote a Boltzmann's constant, and T may denote temperature.

In a continuum scale simulation operation S350, a position of the protection group, a concentration profile of the activated acid, and a concentration profile of the quencher may be mapped from the unit lattice cell of the resist to model a lattice cell of the continuum. In the continuum scale simulation operation S350, FDM simulation(s) may be used, and acid/base diffusion, an acid-base neutralization reaction, and/or a deprotection reaction may be simulated.

For example, the acid/base diffusion and the acid-base neutralization may be simulated through Equations 5 and 6, Fick's second law, and the deprotection reaction between the protection group and the acid may be simulated by the following Equation 7, an Arrhenius equation. For example, in the simulation, the acid concentration and the quencher concentration may be changed by simulating diffusion and/or neutralization reaction(s) of the acid and quencher in a lattice cell, a continuum, based Equations 5 and 6, and a protection ratio of the protection group may be changed based on Equation 7. In this case, time iteration may be performed by applying an explicit method, and a boundary condition, in which acid and base are not introduced and discharged on a cell outer surface, may be applied.

$$\frac{\partial}{\partial t}(A) = \nabla \cdot (D_A \nabla \cdot A) - k_{quen} AQ \quad \text{Equation (5)}$$

$$\frac{\partial}{\partial t}(Q) = \nabla \cdot (D_Q \nabla \cdot Q) - k_{quen} AQ \quad \text{Equation (6)}$$

$$\frac{\partial}{\partial t}(R) = -k_p A_{pro} R, \quad \text{Equation (7)}$$

where A denotes an acid concentration, $D_A$ denotes a diffusion coefficient of acid, Q denotes a concentration of a quencher, $D_Q$ denotes a diffusion coefficient of the quencher, $k_{quen}$ denotes a reaction rate constant of an acid-base neutralization reaction, R denotes a protection ratio of a protection group, $k_p$ denotes a reaction rate constant of deprotection, and $A_{pro}$ denotes a local acid concentration in the protection group.

The protection ratio may decrease from 1 to 0 during a deprotection reaction. For example, as illustrated in Equations 5 and 6, a model of a continuum may be configured to reflect the concentrations of the acid and the quencher decreased by the acid-base neutralization reaction through $k_{quen}AG$ and to reflect diffusion of the acid and the quencher into a photoresist at diffusion coefficients of $D_A$ and $D_Q$, by way of the acid concentration A and the quencher concentration Q. In Equation 7, a model of a continuum may be configured to obtain a local concentration $A_{pro}$ in a position of the protection group by trilinear interpolation for the acid concentration A derived from Equations 5 and 6 and to gradually decrease a protection ratio R from 1 to 0 with time.

Solubility (S350-R) of the polymer chain in the unit lattice cell (e.g., in accordance with the deprotection reaction) may be calculated through Equation 7. The above equations may construct a continuum model to perform a chemical reaction more rapidly in the protection group disposed in a high-concentration region by way of the concentration of the acid.

In a continuum scale simulation operation S350 of the post-exposure bake (PEB) process, operations illustrated in FIG. 4B may be performed. In the continuum scale simulation operation S350, an acid-base neutralization reaction S350A and acid/base diffusion 350B may be taken into account. Since the acid-base neutralization reaction is basically known as a chemically rapid reaction, it may be assumed, stoichiometrically, that the same amount of acid and base are neutralized to disappear through an acid-base neutralization reaction immediately when the acid and the base react with each other, rather than calculating an actual value. For example, a simple stoichiometric assumption may be established that the acid and the base disappear by neutralizing the same amount.

In addition, when the concentration of one of the acid and the base is high, the concentration of the other having a low concentration was set to be calculated as zero in the next operation. Equations 5 and 6, connected to each other by way of the acid concentration A and the quencher concentration Q, include two operations, an acid-base neutralization reaction 350A and acid/base diffusion 350B, as illustrated in FIG. 4B. Accordingly, a continuum model may be constructed to yield numerical solutions of the above equations. Then, a simulation operation of the acid-base neutralization reaction S350A and the acid/base diffusion 350B may be repeatedly performed until more time than the PEB time elapses. Then, in the deprotection reaction S350C, the solubility (S350-R) of the polymer chain may be yielded as in FIG. 4A through operation S351 of obtaining a local concentration $A_{pro}$ in the position of the protection group using trilinear interpolation for the acid concentration A yielded from Equations 5 and 6, operation S353 of calculating a deprotection ratio $R^t$, and operation S353 of calculating a deprotection ratio of each chain.

As can be seen from FIG. 4A, calculation results may be used for each other between simulations of each scale. For example, the solubility (S350-R) of the polymer chain calculated in the continuum scale simulation operation S350 may be transmitted to the molecular scale simulation operation S330, and the soluble polymer chain in the unit cell may be removed to estimate a shape of a final virtual resist pattern (S330-R2).

Figure 5A:
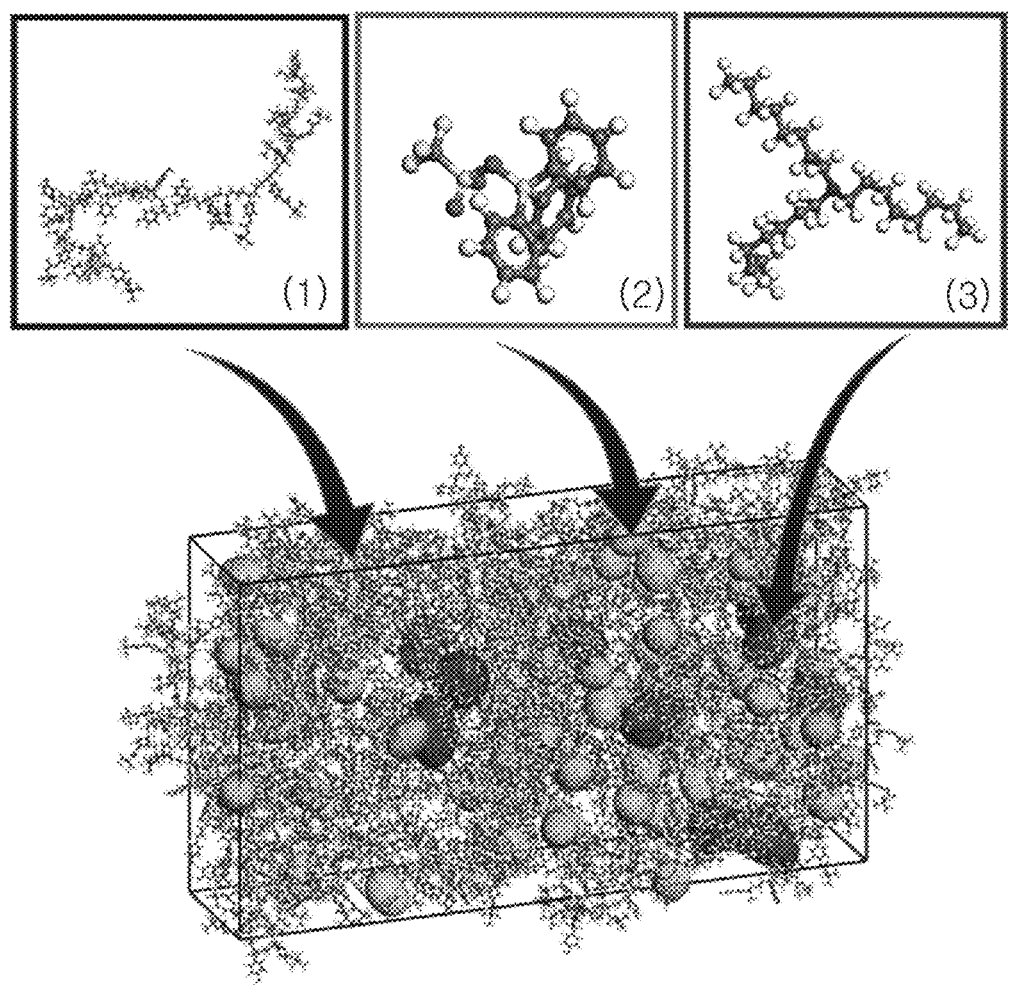
FIGS. 5A and 5B are conceptual diagrams of a unit lattice cell of a resist.
Figure 5B:
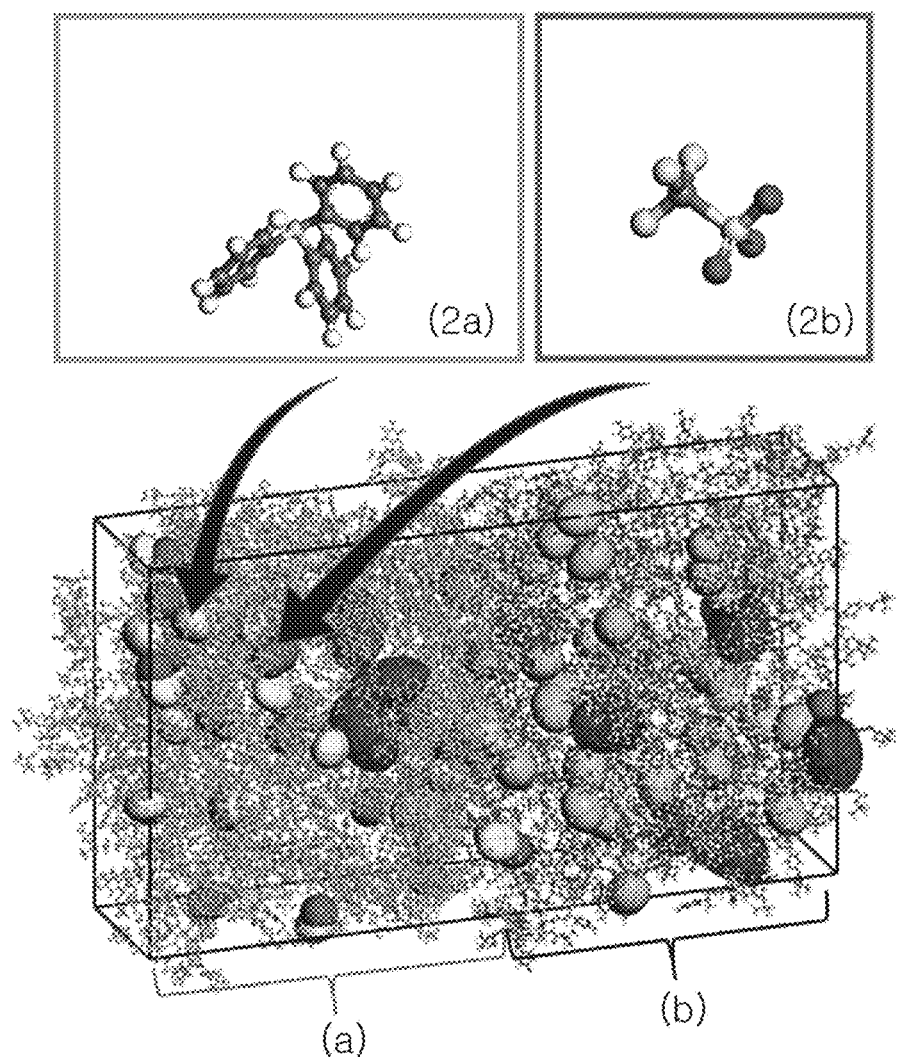

FIGS. 5A and 5B are conceptual diagrams of a unit lattice cell of a resist.

FIGS. 5A and 5B illustrate a process in which an acid is activated by exposure in a unit lattice cell of a resist in which a polymer chain 1, a PAG 2, and quencher 3 are combined with each other. A molecular structure of the polymer chain 1, the PAG 2, and the quencher 3 is merely examples, and may be other types of molecule may be used according to some example embodiments. The polymer chain may include a combination of at least one protection group and at least one non-protection group. In FIG. 5A, the ovals indicated by the middle arrow represent PAGs 2, and the ellipses indicated by the right arrow represent quenchers 3. FIG. 5A illustrates a unit lattice cell of a resist before being exposed, and FIG. 5B illustrates a unit lattice cell immediately after being exposed. In a unit lattice cell, a region indicated by "a" of FIG. 5B represents an exposed region, and a region indicated by "b" of FIG. 5B represents a pristine region (e.g., an unexposed region). Secondary electrons may be generated in the exposure region "a" and may combine with the PAGs 2 to cause a dissociation reaction of the PAGs 2. FIG. 5B illustrates a process in which the exposed PAGs 2 are dissociated into PAG cations and anions, for example, in an acid activation process. In FIG. 5B, the ovals indicated by a left arrow represent PGS cations 2a and the ovals indicated by a right arrow represent dissociated PAG anions 2b.

The quencher may be, for example, a photo decomposable quencher (PDQ). When the quencher is a PDQ, the PDQ may be activated with a weak acid in the exposed region and a little neutralization reaction with the acid activated by PAG may slightly or hardly occur. However, the PDQ may be present as a base in the unexposed region and may cause an acid-base neutralization reaction in an interface between the exposed region and the unexposed region to suppress diffusion of the acid to the unexposed region. According to some example embodiments, since not only a behavior of the acid caused by dissociation of a PGS but also a behavior of the quencher in the exposed region and the unexposed region may be simulated, consistency of a resist pattern may be significantly improved.

In the lithography method according to embodiments, for example, by applying a multiscale simulation to material compositions of a carbonate-based polymer chain, a sulfonic acid generator based PAG, and a quencher, a photochemical reaction of exposure→PAG dissociation→acid activation-→acid-base neutralization reaction→acid/base diffusion is illustrated. The material composition of the resist, to which the multiscale simulation and corresponding lithography method is applied, is not limited to the above-mentioned material composition. A quantum scale DFT simulation and a molecular scale MD simulation may be used for such a photochemical reaction.

For example, a unit lattice cell of a resist may be modeled using an MD simulation and a PAG dissociation energy curve, calculated through a DFT simulation, and applied to a force field of each PAG disposed in the exposed region of the unit lattice cell. Within nanoseconds after calculation of an NPT ensemble, a PAG may be dissociated and/or divided into PAG cations and PAG anions. Again, concentration profile information of acid activated from dissociated anions and concentration profile information of a quencher may be quantified through the MD simulation. As a result, the acid concentration profile and the quencher concentration profile may be detected, and corresponding information may be used later in a continuum scale simulation.

Figure 6A:
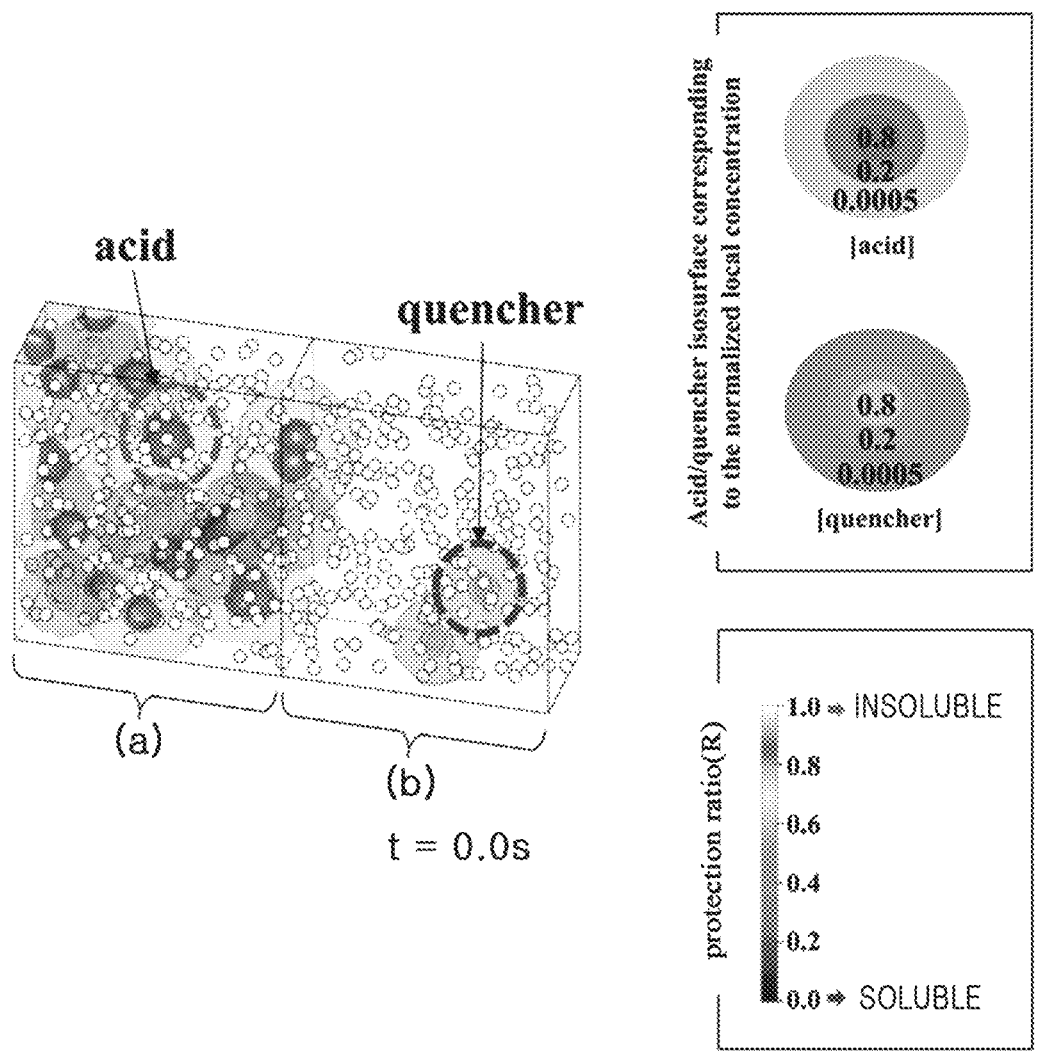
FIGS. 6A to 6F are conceptual diagrams illustrating acid/base diffusion, acid-base neutralization reaction, and deprotection.
Figure 6B:
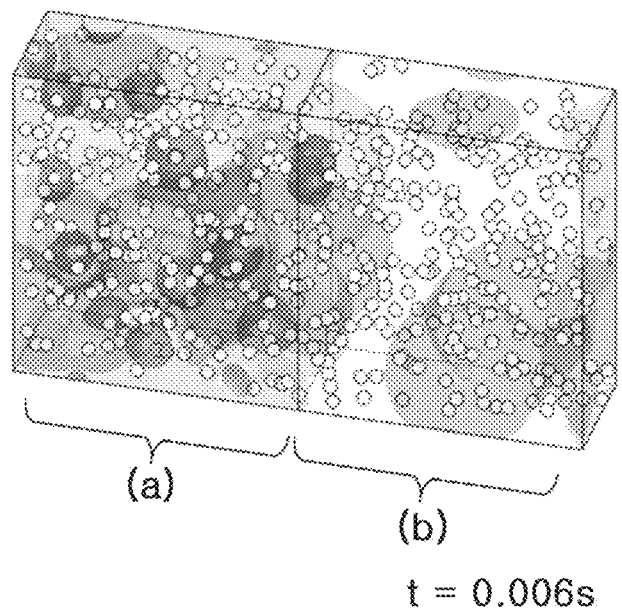

FIGS. 6A to 6F are conceptual diagrams illustrating acid/base diffusion, acid-base neutralization reaction, and deprotection. FIG. 6A illustrates a concentration profile of an activated acid and a concentration profile of a quencher, a base, through an MD simulation. The acid and quencher concentrations vary as represented by a dark color and light colors for each position, and small circles in a black outline represent protection groups of a polymer chain.

Referring to FIGS. 6A to 6F, in a lithography method of the present example embodiments, similarly to the description provided with reference to FIGS. 5D and 5E, by applying a multiscale simulation to a material composition of a carbonate-based polymer chain, a sulfonic acid generator based PAG, a quencher, acid/base diffusion, an acid-base neutralization reaction, and a deprotection reaction are illustrated. A continuum scale FDM simulation may be used for the acid/base diffusion, the acid-base neutralization reaction, and the deprotection reaction.

For example, a local acid concentration $A_{pro}$ within a unit lattice cell and a change in protection ratio R of the protection group may be calculated using a FDM simulation. For example, the acid concentration $A_{pro}$ may be calculated through Equation 5 and Equation 6, and the change in the protection ratio R may be calculated through Equation 7. As a result, it may be confirmed that the acid/base diffusion and/or the acid-base neutralization reaction may occur in the unit lattice cell, and a chemical reaction (for example, the deprotection reaction) is rapidly performed on only the protection group in a corresponding region due to the acid. In this case, the protection ratio R of the protection group may be used to select soluble polymer chains.

In FIG. 6A, two rectangular boxes include an upper rectangular box and a lower rectangular box. In the lower box, a protection ratio of a protection group is continuously denoted with dark and light colors. When the protection ratio is 1, the protection group may be insoluble in a polar solvent. As the protection ratio is decreased to zero, solubility of polar solvents may be increased.

In the upper rectangular box, an acid/base concentration profile is divided into three levels and denoted with dark and light colors using an equivalent curved surface of quantified local concentration. For example, the acid concentration profile may gradually decrease from a core-surface having an acid concentration A of 0.8 through a mid-surface having an acid concentration of 0.2 to an outer-surface having an acid concentration of 0.0005. Similarly, a base concentration profile may gradually decrease from a core-surface having a base concentration Q of 0.8 through a mid-surface having a base concentration of 0.2 to an outer-surface having a base concentration Q of 0.0005.

Figure 6C:
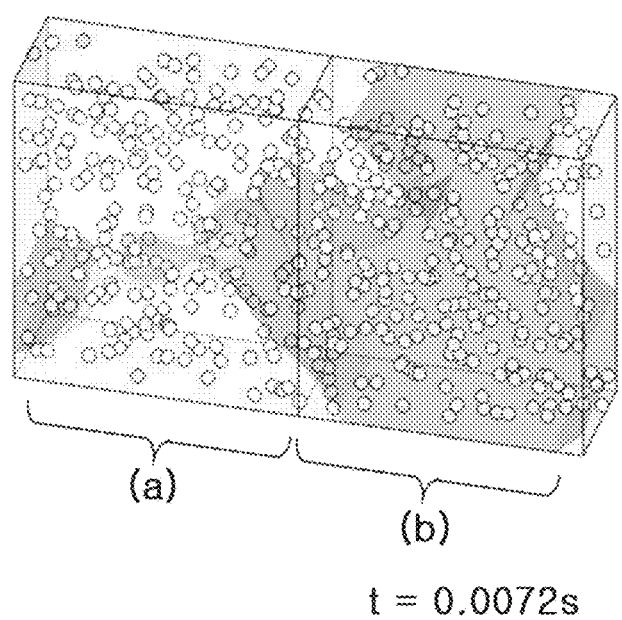
Figure 6D:
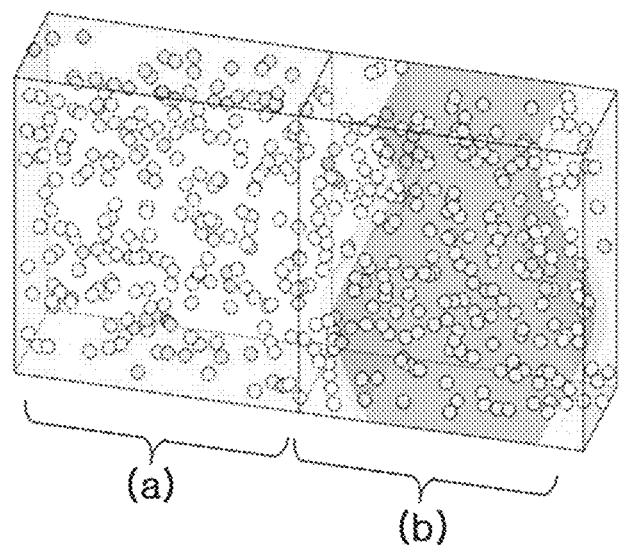

In FIGS. 6A to 6D, it can be seen that a neutralization reaction is performed while an acid and a base gradually diffuse, so that the concentrations of the acid and the quencher may be decreased, respectively. It also can be seen that each of the core-surface and the mid-surface is absorbed to the outer-surface while each of the acid and base diffuses, and the outer-surface fills an internal space of the unit lattice cell. The acid-base neutralization reaction may be performed and the acid and quencher may disappear at an interface in which respective outer-surface intersect each other. In FIGS. 6C and 6D, it can be seen that as PEB time elapses, a quencher concentration is continuously decreased to contract the outer-surface and to expand an outer-surface of the acid. From the beginning of the PEB process, the acid may attack surrounding protection groups to cause a deprotection reaction. The deprotection reaction may preferentially start in a protection group surrounded by a high-concentration acid. As illustrated in FIG. 6D, performing of a deprotection reaction in an unexposed region, in which a quencher concentration remains, may be slower than performing of a deprotection reaction in an exposed region. The quencher, present in the unexposed region, may control diffusion of the acid from the exposed region to the unexposed region.

Figure 6E:
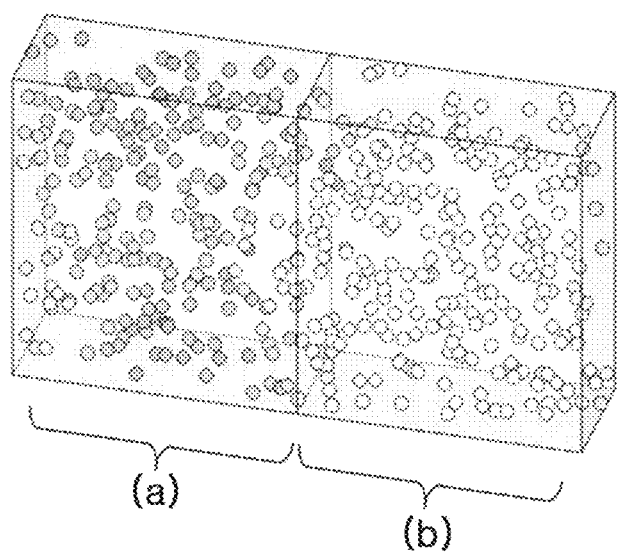
Figure 6F:
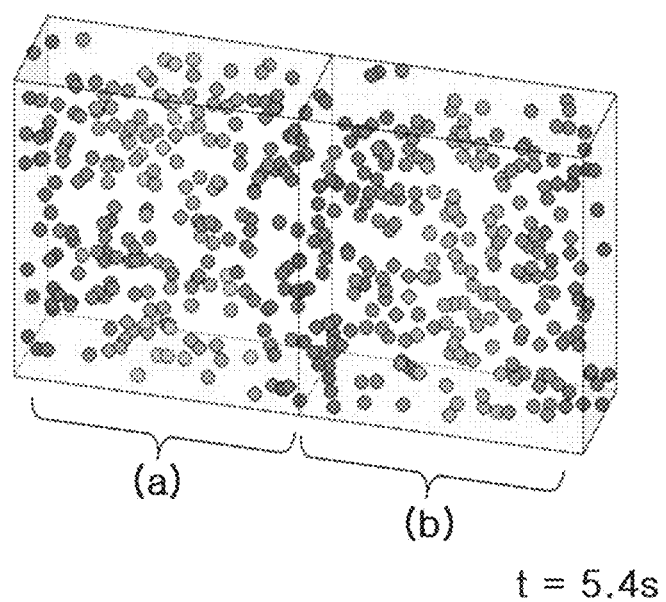

In FIGS. 6E and 6F, acid diffusions and protection ratios are illustrated. As can be seen in the drawings, a light-colored portion of acid diffuses to an unexposed region to diffuse an acid concentration to the unexposed region and protection groups in the unexposed region may decrease in a protection ratio due to a deprotection reaction. In this case, the protection groups in the exposure region may significantly decrease in a protection ratio because the deprotection reaction is not performed to a great extent. When the protection ratio is about 0.2, a corresponding protection group may be set as having solubility. However, example embodiments are not limited thereto and the protection ratio set as having solubility may vary depending on the kind of resist and/or developer. The term "solubility" may refer to solubility for a developing solvent.

Figure 7A:
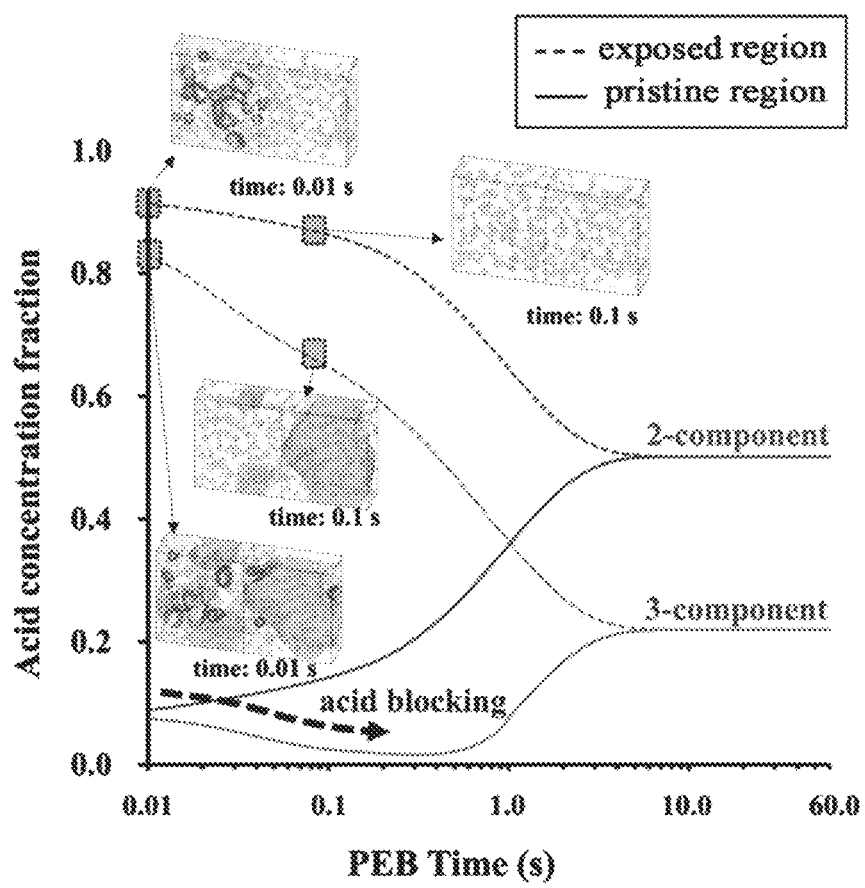
FIGS. 7A and 7B are views illustrating a comparison between a result of a multiscale simulation of a 2-component system and a result of a multiscale simulation of a 3-component system.
Figure 7B:
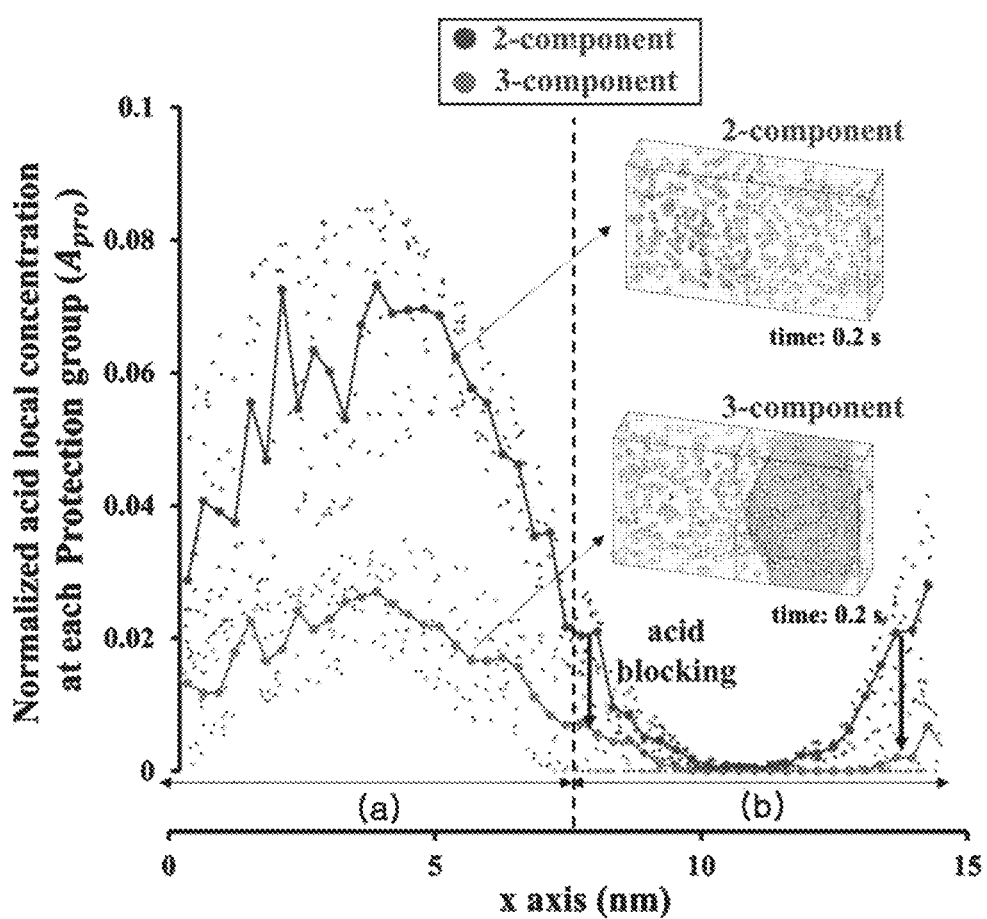

FIGS. 7A and 7B are views illustrating a comparison between a result of a multiscale simulation of a 2-component system (hereinafter referred to a "comparative example") and a result of a multiscale simulation of a 3-component system.

The comparative example is a system considering a polymer chain and a PAG, and the 3-component system is a system considering a polymer chain, a PAG, and a quencher. In FIG. 7A, X-axis represents PEB time, Y-axis represents a concentration ratio of acid, a dashed-line graph represents a change in acid concentration ratio in an exposed region, and a solid-line graph represents a change in acid concentration ratio in an unexposed region. In FIG. 7B, X-axis represents a position, Y-axis represents a protection ratio, and a dashed line extending in a direction, perpendicular to a central portion of the X-axis, separates an exposed region and an unexposed region from each other.

In FIG. 7A, it can be seen that in the comparative example, 30% of acid was generated for 0 to 1.0 seconds and a concentration of acid in an exposed region diffuses to an unexposed region, and thus, a unit lattice cell slowly reached an equilibrium state in about 6.4 seconds. It also can be seen that in the comparative example, the concentration of the acid was continuously increased in the unexposed region. It also can be seen that in the present disclosure, a concentration of acid in an unexposed region was decreased by an acid-base neutralization reaction for 0.02 to 0.1 seconds and was then increased again. Such a result shows that a quencher suppresses diffusion of acid to the unexposed region. Such a decrease in acid concentration may play an important role in delaying deprotection. In the exposed region, the acid was neutralized with the quencher, and thus, the acid concentration was decreased more rapidly than in the comparative example. Then, the remaining acid diffused to the entire unit lattice cell and reached an equilibrium state in about 7.4 seconds.

In FIG. 7B, a change in local acid concentration in a protection group in X-axis is illustrated. In an unexposed region, a concentration of acid according to the 3-component system is lower than a concentration of acid according to the comparative example. This is because a quencher serves to suppress diffusion of the acid to the unexposed region. As illustrated in FIGS. 7A and 7B, the present disclosure may further consider the quencher, a base, as compared with the comparative example, so that a development aspect of a chemical reaction changed by an acid-base neutralization reaction and estimation of a pattern shape resulting from the development aspect may be more realistic.

Figure 8A:
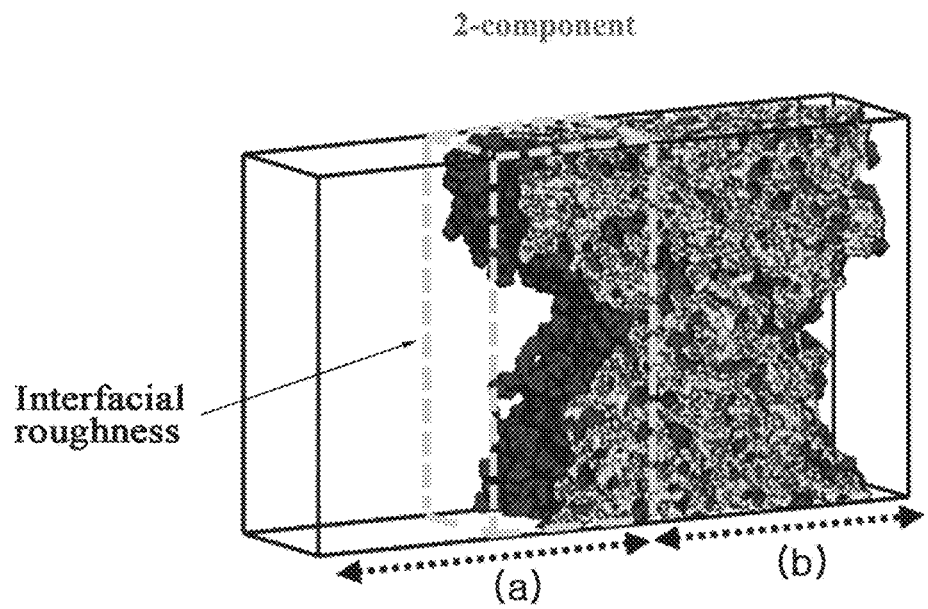
FIGS. 8A and 8B are views illustrating LER obtained by a multiscale simulation of a 2-component system and LER obtained by a multiscale simulation of a 3-component system, respectively.
Figure 8B:
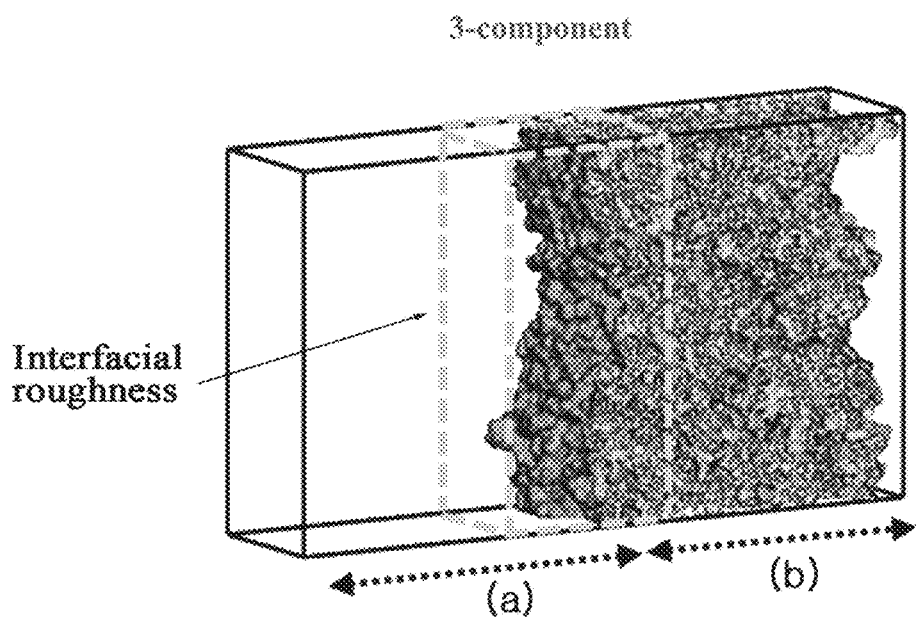

FIGS. 8A and 8B are views illustrating LER obtained by a multiscale simulation of a 2-component system and LER obtained by a multiscale simulation of a 3-component system, respectively. FIGS. 8A and 8B illustrate a shape of a pattern remaining after removal of a dissolved polymer chain in an MD simulation according to the comparative example and the present disclosure.

In FIGS. 8A and 8B, it can be seen that interface roughness between an exposed region and an unexposed region is improved in the 3-component system, as compared with the comparative example. For example, LER in the comparative example was at a level of 2.0 nm or less but LER in the present disclosure was at a level of 1.7 nm or less. This is because the quencher simulated suppression of diffusion of acid diffusion to the unexposed region to be closer to an actual situation.

Figure 9:
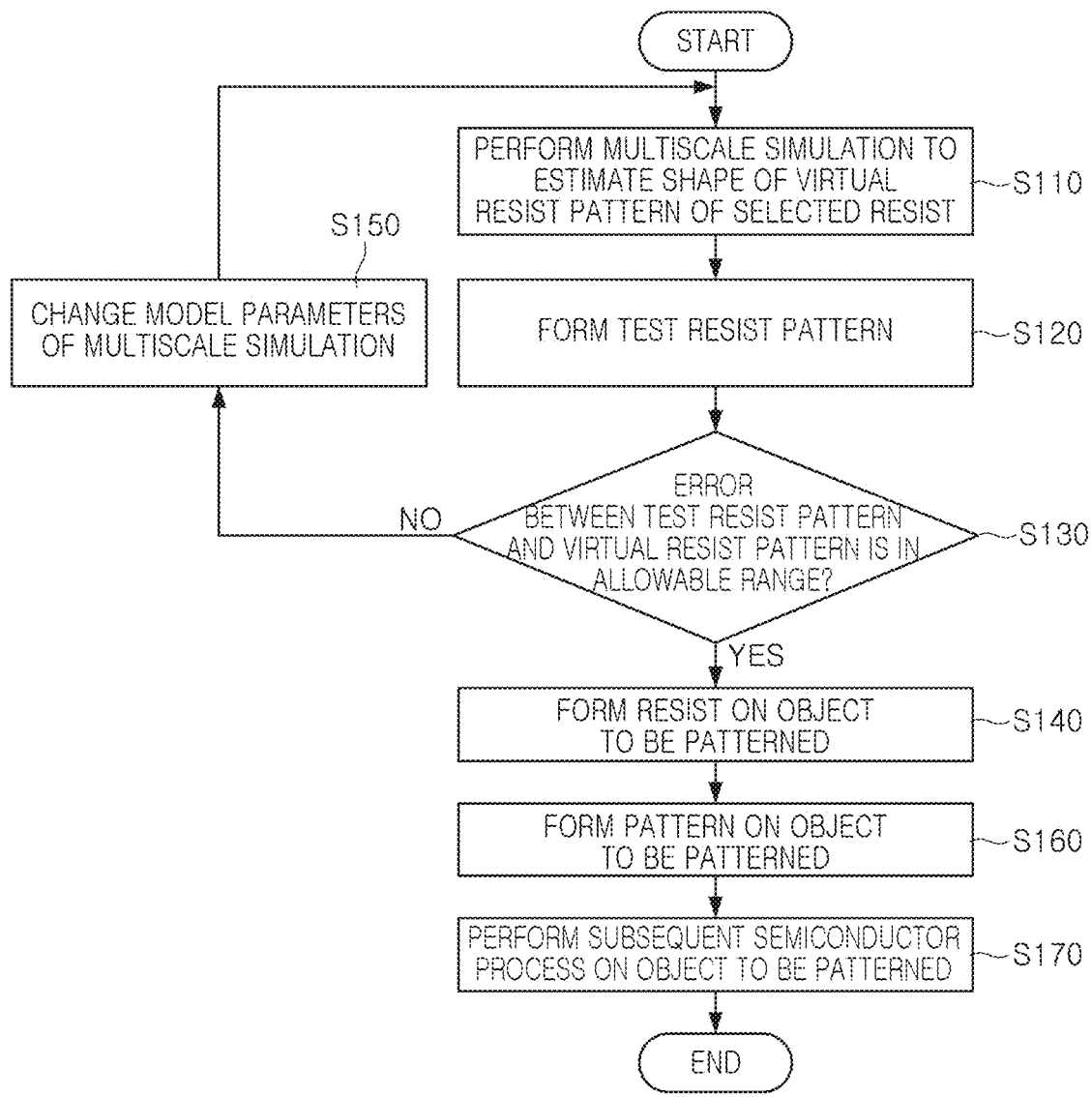
FIG. 9 is a flowchart illustrating a method of manufacturing a semiconductor device based on the lithography method of FIG. 1 according to some example embodiments.

FIG. 9 is a flowchart illustrating a method of manufacturing a semiconductor device based on the lithography method of FIG. 1 according to some example embodiments. The descriptions previously provided with reference to FIGS. 1 to 8 will be simplified or omitted.

Referring to FIG. 9, operation S110 of estimating a shape of a virtual resist pattern to operation S140 of forming a resist pattern on an object to be patterned (hereinafter referred to as a "patterning object") are sequentially performed. Details of the operations are the same as those described with reference to FIGS. 1, 3A, and 3B.

In operation S160, a pattern is formed on the patterning object. The pattern on the patterning object (see W of FIG. 11B) may be formed by an etching process using a resist pattern as an etching mask. The etching process may be a dry etching process and/or a wet etching process, and the pattern may be formed on the patterning object using at least one of the dry etching process and/or the wet etching process.

After the pattern is formed on the patterning object W, subsequent semiconductor processes are performed on the patterning object, in operation S170. A semiconductor device may be manufactured by performing the subsequent semiconductor processes on the patterning object W. For example, when the patterning object W is a wafer, a plurality of semiconductor devices may be manufactured from the wafer by performing the subsequent semiconductor processes on the wafer.

The subsequent semiconductor processes performed on the wafer may include various processes. For example, the subsequent semiconductor process on the wafer may include a deposition process, an etching process, an ion implantation process, a cleaning process, and/or the like. In addition, the subsequent semiconductor processes performed on the wafer may include a process of testing a wafer-level semiconductor device. Furthermore, the subsequent semiconductor processes performed on the wafer may include a singulation process of dividing the wafer into individual semiconductor chips and a process of packaging the semiconductor chips. The packaging process may refer to a process of mounting the semiconductor chips on a printed circuit board (PCB) and encapsulating the semiconductor chips with an encapsulant, and may include stacking a plurality of semiconductors on the PCB to form a stack package or stacking one stack package on another stack package to form a package-on-package (PoP) structure. Through the process of packaging the semiconductor chips, a semiconductor device or a semiconductor package may be completed.

Figure 10:
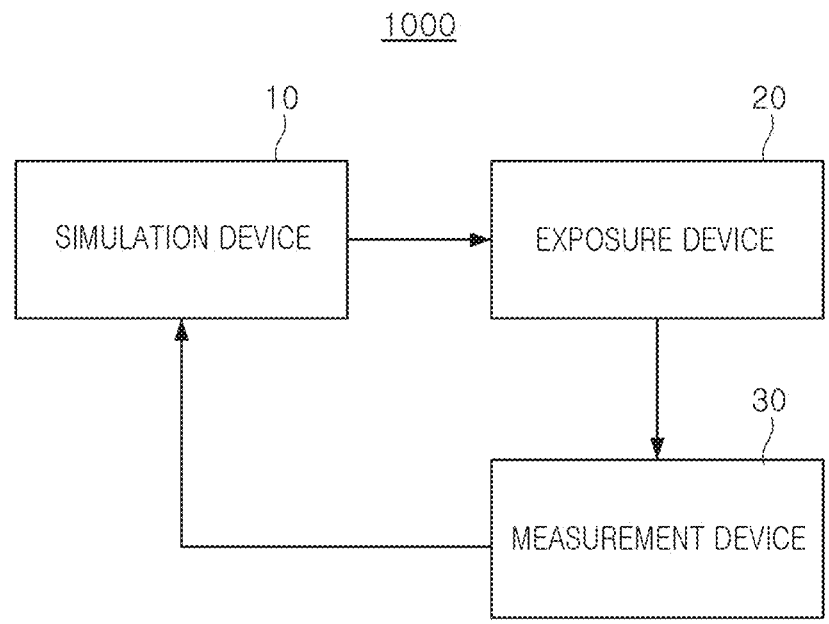
FIG. 10 is a block diagram of exposure equipment based on the lithography method of FIG. 1 according to some example embodiments.

FIG. 10 is a block diagram of exposure equipment based on the lithography method of FIG. 1 according to some example embodiments.

Referring to FIG. 10, exposure equipment 1000 according to the some example embodiments may include a simulation device 10, an exposure device 20, and a measurement device 30. The simulation device 10 may estimate a shape of a virtual resist pattern, using a multiscale simulation, in the lithography method described above with reference to FIG. 1. According to some example embodiments, though illustrated as included in the exposure equipment 1000, the simulation device 10 may be excluded from the exposure equipment 1000 and/or distinguished as a separate device. The simulation device 10 will be described in more detail with reference to FIG. 11A.

The exposure device 200 may perform an exposure process on a resist. The exposure device 20 may perform an exposure process on a layer, formed of a selected resist, to form a test resist pattern. The resist may be selected based on a result of the multiscale simulation of the simulation device 10. The exposure device 20 may be, for example, an extreme ultraviolet (EUV) exposure device. However, the exposure device 20 is not limited to the EUV exposure device. A structure of the exposure device 20 will be described in more detail with reference to FIG. 11B.

The measurement device 30 may measure the test resist pattern, formed by the exposure device 20, or a resist pattern on an object to be patterned (hereinafter referred to as a "patterning object") to compare the test resist pattern with a virtual resist pattern. For example, the measurement device 30 may measure CD, LER, LWR, and LCDU for the test resist pattern or the resist pattern on the patterning object. In some embodiments, for example, the measurement device 30 may include a probe, a photoreceptor, a light source, and/or a microscope. According some example embodiments, though illustrated as being included in the exposure equipment 1000, the measurement device 30 may be excluded from the exposure equipment 1000 and/or distinguished as a separate device.

The exposure equipment 1000 may include a simulation device 10 performing a multiscale simulation. Accordingly, the exposure equipment 1000 may estimate a shape of the virtual resist pattern using the simulation device 10 to select an optimal resist and to form a resist pattern using the resist selected by the exposure device 20. For example, the simulation device 10 may simulate PAG dissociation, acid activation, an acid-base neutralization reaction, acid/base diffusion, and/or a deprotection reaction in a unit lattice cell of the resist. As a result, the exposure equipment 1000 may accurately form a resist pattern matching an object resist pattern within an allowable range, and then may pattern the patterning object using the resist pattern to form a precise pattern on the patterning object. Accordingly, the exposure equipment 1000 may contribute to manufacturing of a semiconductor device having improved reliability.

The exposure equipment 1000 may be combined with a deep learning and/or artificial intelligence (AI) technology to further improve consistency of the estimation of the pattern shape. For example, a more precise pattern may be formed through machine learning for sampling a semiconductor wafer formed of a resist selected by the simulation device 10 and a plurality of semiconductor elements formed from the wafer.

Figure 11A:
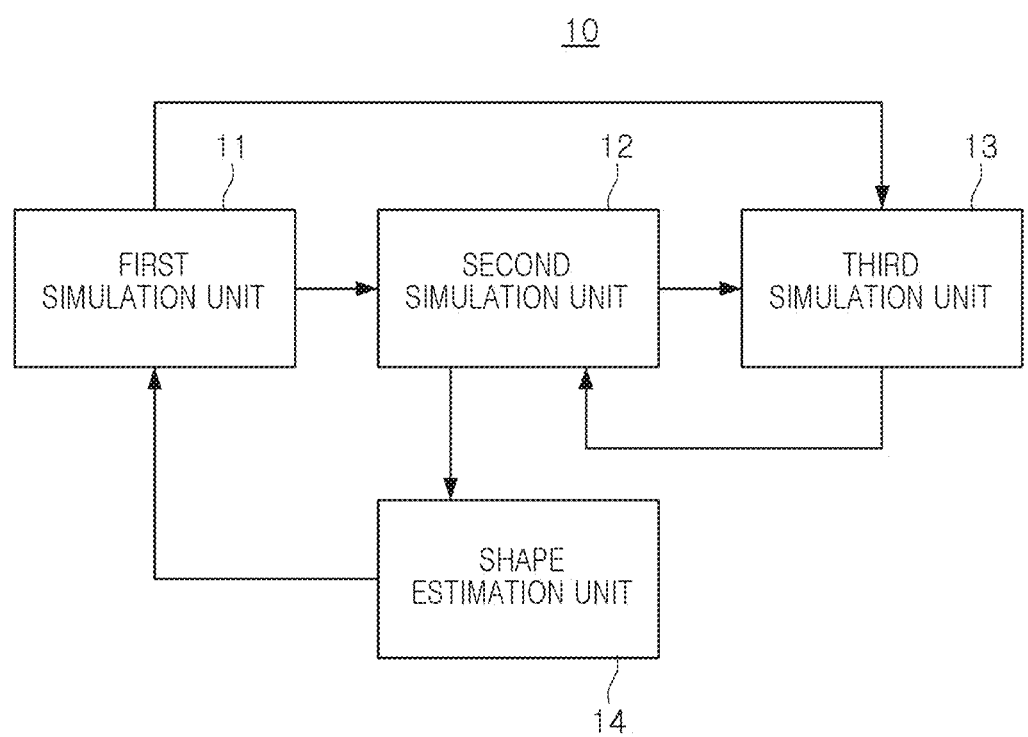
FIG. 11A is a block diagram illustrating a simulation device in the exposure equipment of FIG. 10.
Figure 11B:
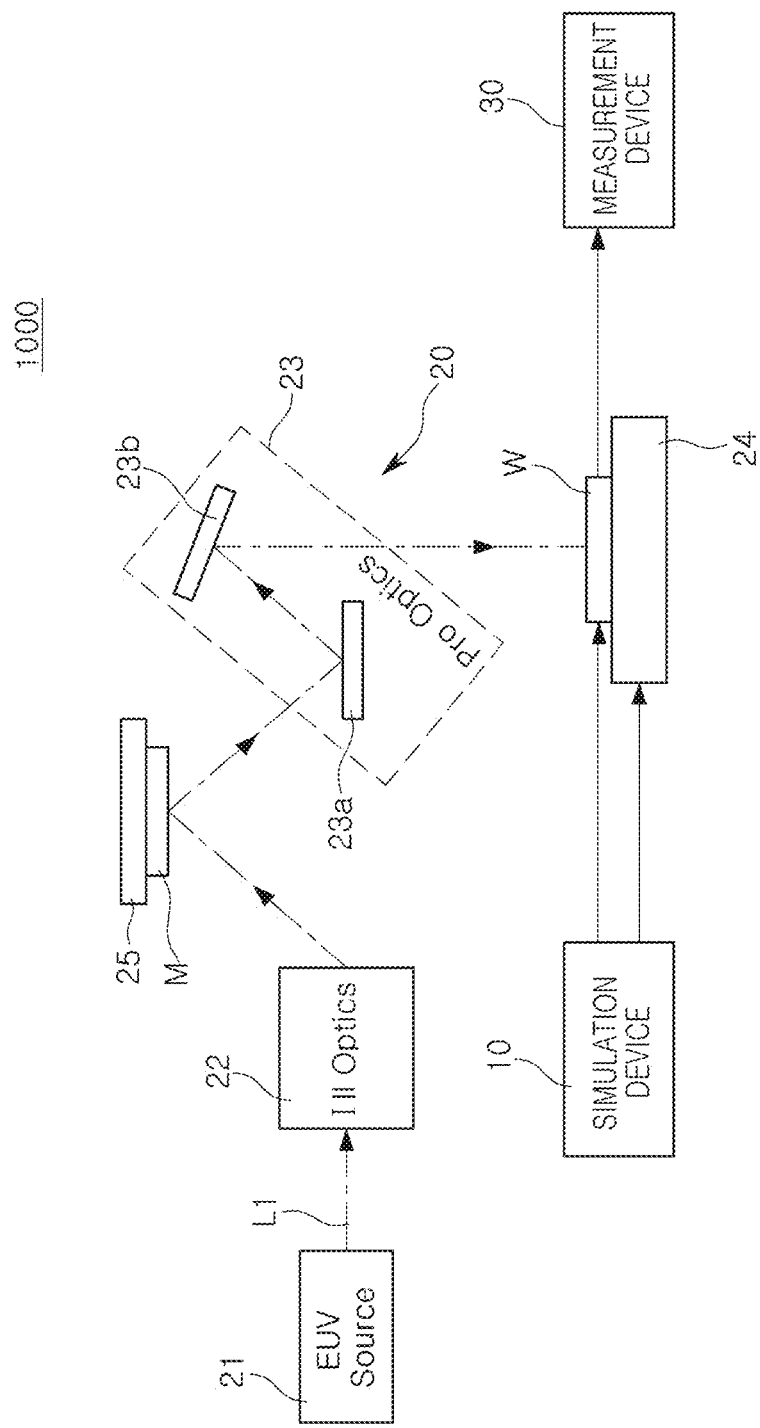
FIG. 11B is a block diagram illustrating an exposure device in the exposure equipment of FIG. 10.

FIG. 11A is a block diagram illustrating a simulation device in the exposure equipment of FIG. 10, and FIG. 11B is a block diagram illustrating an exposure device in the exposure equipment of FIG. 10.

Referring to FIG. 11A, in the exposure equipment 1000 according to the present embodiment, the simulation device 10 may include first to third simulation units 11, 12, and 13 and a shape estimation unit 14. The first simulation unit 11 may perform a quantum scale simulation. For example, the first simulation unit 11 may perform a DFT simulation. The second simulation unit 12 may perform a molecular scale simulation. For example, the second simulation unit 12 may perform an MD simulation. The third simulation unit 13 may perform a continuum scale simulation. For example, the third simulation unit 13 may perform an FDM simulation. The first to third simulation units 11, 12, and 13 may be organically connected to each other.

The shape estimation unit 14 may estimate a shape of a virtual resist pattern formed by the first to third simulation units 11, 12, and 13. Also, the shape estimation unit 14 may calculates critical dimension (CD), line edge roughness (LER), line width roughness (LWR), local critical dimension uniformity (LCU), and the like, to quantify patterning performance for a material composition of a selected resist. According to example embodiments, a function of the shape estimation unit 14 may be integrated into the second simulation unit 12 to be performed.

The simulation device 10 and/or its component elements (e.g., the first to third simulation units 11, 12, and 13 and/or a shape estimation unit 14) may include and/or be included in processing circuitry such as hardware including logic circuits; a hardware/software combination such as a processor executing software; and/or a combination thereof. For example, the processing circuitry more specifically may include, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), complex programmable logic devices (CPLD), firmware driven in hardware devices, integrated circuits (IC), an application specific IC (ASIC), etc.

Referring to FIG. 11B, in the exposure equipment 1000, the exposure device 20 may be an extreme ultraviolet (EUV) exposure device. The exposure device 20 is not limited to the EUV exposure device. Hereinafter, however, for ease of description, exposure device 20 will be mainly described as an EUV exposure device. The exposure device 20 may include an EUV light source 21, an illumination optics (Ill Optics) 22, a projection optics (Pro Optics) 23, a stage 24, and a mask support 25.

The EUV light source 210 may generate high-energy-density EUV L1 within a wavelength range of about 5 nm to 50 nm, and then may output the EUV L1. For example, the EUV light source 21 may generate and output high-energy-density EUV L1 having a wavelength of 13.5 nm.

The illumination optics 22 may include a plurality of mirrors, and may transmit the EUV L1 from the EUV light source 21 to an EUV mask M on the mask support 25. For example, the EUV L1 from the EUV light source 21 may be incident on the EUV mask M disposed on the mask support 25 through reflection performed by the mirrors in the illumination optics 22.

The EUV mask M may be a reflective mask including a reflection region, a non-reflection, and/or intermediate reflection region. The EUV mask M may include a reflection multilayer for reflecting EUV on a substrate, formed of a low thermal expansion coefficient material (LTEM) such as quartz, and an absorption layer pattern formed on the reflection multilayer. The reflection multilayer may have, for example, a structure in which at least dozens of molybdenum (Mo) layers and silicon (Si) layers are alternately stacked. The absorption layer may be formed of, for example, TaN, TaNO, TaBO, Ni, Au, Ag, C, Te, Pt, Pd, Cr, and/or the like. However, a material of the reflection multilayer and a material of the absorption layer are not limited to the above-mentioned materials. An absorption layer portion may correspond to the non-reflection and/or intermediate reflection region.

The EUV mask M may reflect the EUV L1 incident through the illumination optics 22, and may have the reflected EUV L1 incident on the protection optics 23. More specifically, the EUV mask M may structuralize the illumination light from the illumination optics 220 to projection light based on a shape of a pattern including the reflection multilayer and the absorption layer on a substrate, and may have the projection light incident on the projection optics 23. The projection light may be structuralized through at least secondary diffraction order due to the pattern of the EUV mask M. The projection light may be incident on the projection optics 23 with shape information of the pattern on the EUV mask M, and may pass through the projection optics 23 to transcribe an image, corresponding to the pattern of the EUV mask M, onto an object W to be patterned (hereinafter referred to as a "patterning object" W).

The patterning object W may be a substrate including a semiconductor material such as silicon (Si), for example, a wafer. The patterning object W exposed to the projection light may be a resist applied on the patterning object W, for example, an EUV resist. Performing an exposure process on the patterning object W will be described in detail later with reference to FIGS. 12A to 13.

The patterning object W may be disposed on the stage 240. The stage 240 may move in X and Y directions on an X-Y plane and may move in a Z direction, perpendicular to the X-Y plane. For example, the stage 240 may be configured to move in the directions of a lateral plane (e.g., forward/backward and/or left/right) and may move up and/or down. Accordingly, the movement of the stage 240 may allow the patterning object W to move in the X, Y, and Z directions.

The projection optics 230 may include a plurality of mirrors. In FIG. 11B, for easy of description, only two mirrors (a first mirror 23a and a second mirror 23b) are illustrated in the projection optics 23. However, the projection optics 23 may include more mirrors. For example, the projection optics 23 may include four to eight mirrors. However, the number of mirrors included in the projection optics 23 is not limited to the above numerical values.

Figure 12A:
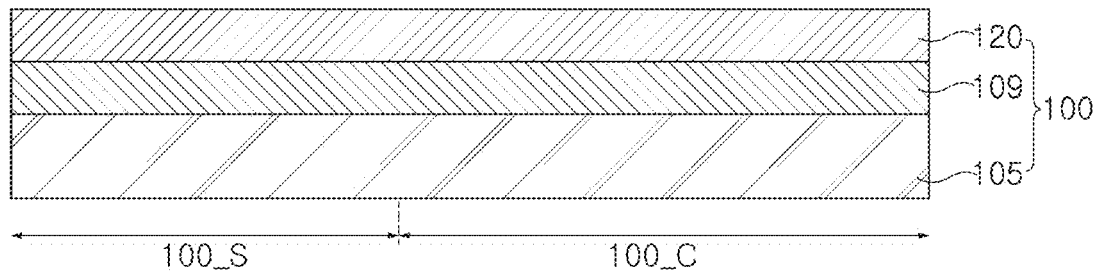
FIGS. 12A to 12C are schematic cross-sectional views illustrating a method of manufacturing a semiconductor device according to an example embodiment.
Figure 12B:
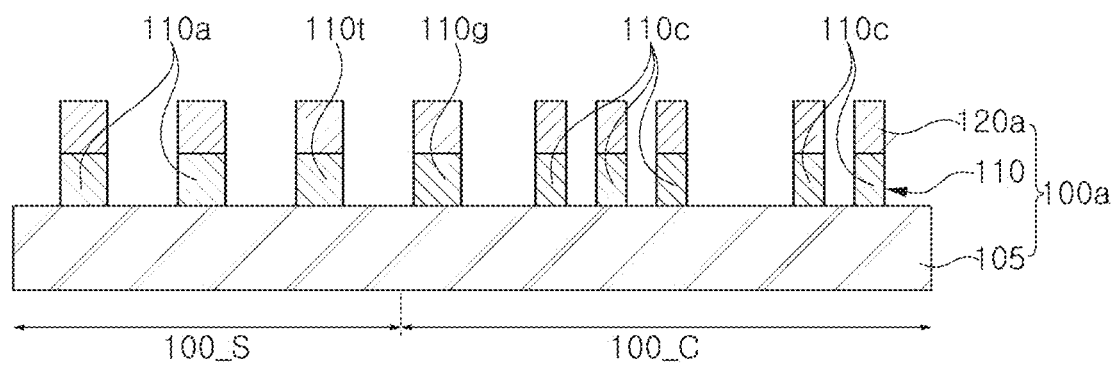
Figure 12C:
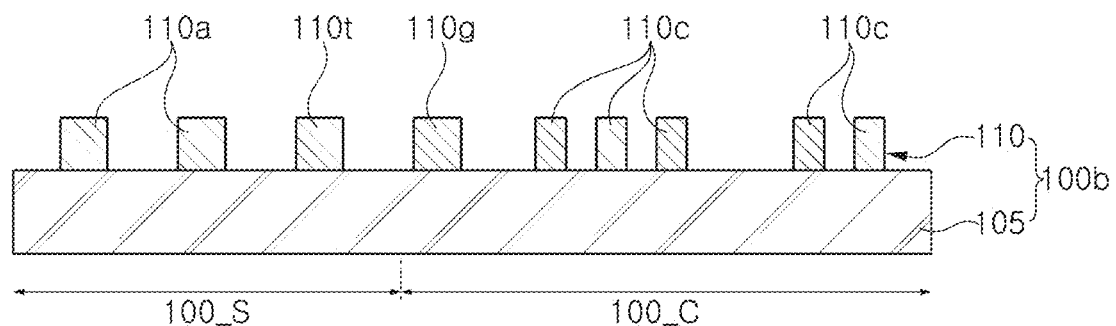

FIGS. 12A to 12C are schematic cross-sectional views illustrating a method of manufacturing a semiconductor device according to an example embodiment. FIGS. 12A to 12C may illustrate examples of a method of manufacturing a semiconductor device using a photoresist layer 120 with a resist composition optimized by a simulation device (10 of FIG. 11A) performing a multiscale simulation.

Referring to FIGS. 12A to 12C, a photoresist layer 120 may be formed on a surface of a semiconductor wafer 100 by a spin coating process. The semiconductor wafer 100 may include a semiconductor substrate 105, a lower layer 109 on the semiconductor substrate 105, and a photoresist layer 120 coated on the lower layer 109. The photoresist layer 120 may be formed with a resist composition optimized by a simulation device (10 of FIG. 11A) performing a multiscale simulation.

In some examples, when the exposure equipment 1000 is an EUV exposure equipment, the photoresist layer may have a thickness between about 200 nm and about 600 nm. However, according to some example embodiments, the thickness of the photoresist layer is not limited to the thickness between about 200 nm and about 600 nm, but may be less than about 200 nm or greater than about 600 nm.

The photoresist layer 120 of the semiconductor wafer 100 may be exposed by sequentially performing a one-shot process, including aligning a wafer and irradiating light generated by a light source, twice or more. The semiconductor wafer 100 may be unloaded from the exposure equipment 1000. The photoresist layer 120, to be exposed, of the semiconductor wafer 100 may be developed to form a photoresist pattern 120a.

By performing an etching process using the photoresist pattern 120a as an etching mask, the lower layer 109 of the semiconductor wafer 100 may be etched to form lower patterns 110 including an alignment mark 110a, a test device pattern 110t, and circuit patterns 110c.

In an example, the lower patterns 110 may further include a guard ring pattern 110g. A semiconductor wafer 100a, including a photoresist pattern 120a and lower patterns 110, may be formed.

Then, the photoresist pattern 120a may be removed. Accordingly, the photoresist pattern 120a may be removed and a semiconductor wafer 100b, including the lower patterns 110, may be formed.

Figure 13:
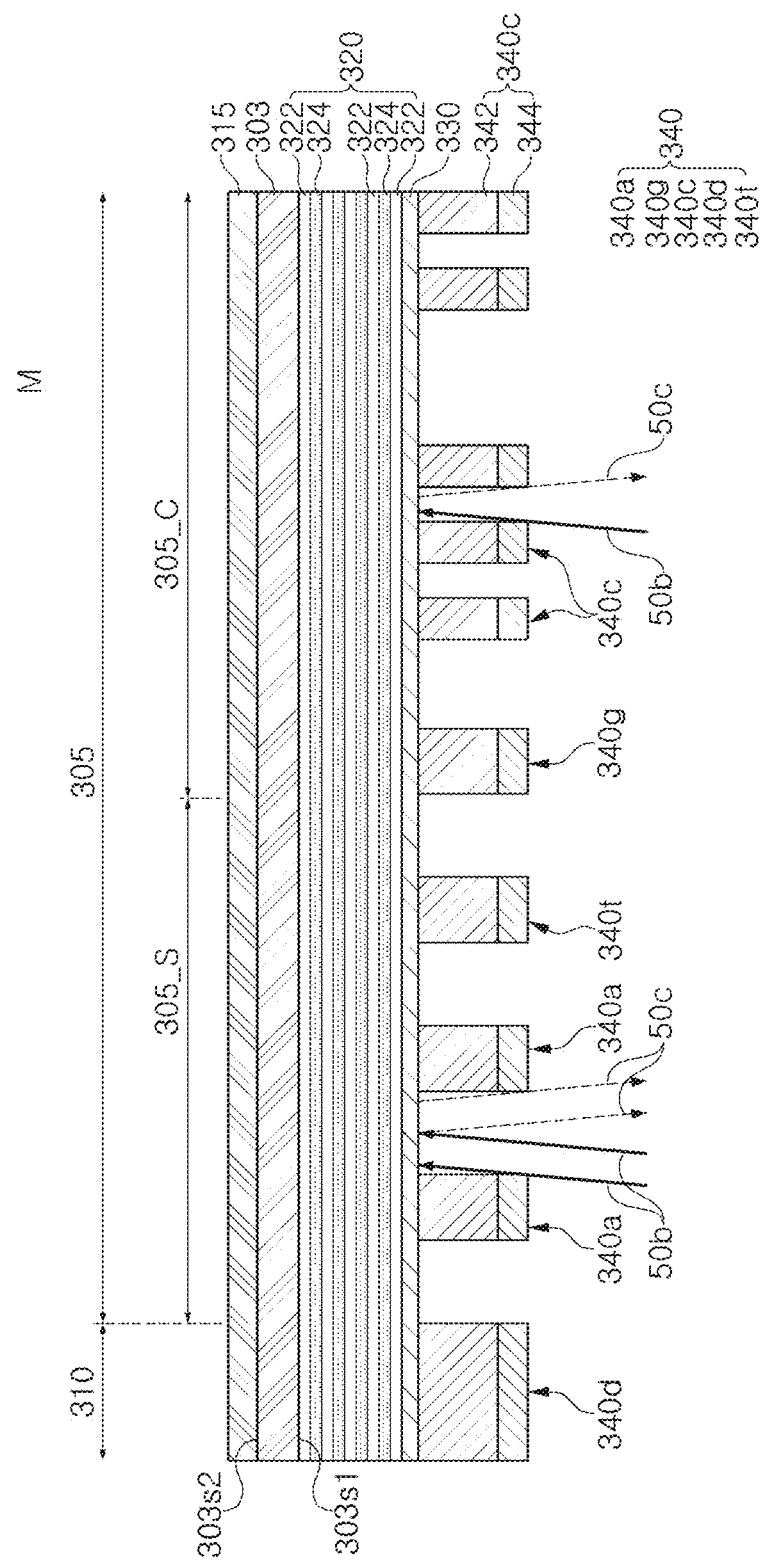
FIG. 13 is a schematic cross-sectional view illustrating an extreme ultraviolet (EUV) photomask for manufacturing a semiconductor device according to an example embodiment.

Next, an extreme ultraviolet (EUV) photomask for manufacturing a semiconductor device according to an example embodiment will be described with reference to FIG. 13. FIG. 13 is a schematic cross-sectional view illustrating an EUV photomask for manufacturing a semiconductor device according to some example embodiments.

Referring to FIG. 13, in an example, an EUV photomask M may include a mask substrate 303, a stack structure 320 disposed below the mask substrate 303, a backside layer 315 disposed above the mask substrate 303, a capping layer 330 disposed below the stacked structure 320, and a plurality of mask patterns 340 disposed below the capping layer 330. For example, the mask substrate 303 may have a first surface 303s1 and a second surface 303s2 opposing each other, and the stack structure 320 may be formed on the first surface 303s1 of the mask substrate 303, the capping layer 330 may be disposed on the stack structure 320, the plurality of mask patterns 340 may be disposed on the capping layer 330, and the backside layer 315 may be in contact with the second surface 303s2 of the mask substrate 303.

The mask substrate 303 may include a low thermal expansion material (LTM). For example, the mask substrate 303 may include a silicon material.

The stacked structure 320 may include a silicon layer 322 and a metal layer 324 stacked alternately and repeatedly. The metal layer 324 may be a molybdenum layer. The capping layer 330 may be a ruthenium layer.

Each of the mask patterns 340 may include a first mask pattern 342 in contact with the capping layer 330 and a second mask pattern 344 below the first mask pattern 342. The first mask pattern 342 may be an absorber including a TaBN material. The second mask pattern 344 may be an anti-reflection layer including a lawrencium material.

The EUV photomask M may include a mask layout region 305 and a border region 310 surrounding the mask layout region 305. The mask layout region 305 may be a region in which a mask layout pattern of the EUV photomask M is formed. The border region 310 may surround the mask layout region 305, and may be a region in which a mask layout pattern is not formed. As described in FIG. 1, the second light 50b incident on the photomask M and the third light 50c reflected from the photomask M may be inclined with respect to an axis, perpendicular to a surface of the photomask M.

The mask layout region 305 of the extreme EUV photomask M may include a mask chip region 305_C and a mask scribe lane region 305_S surrounding the mask chip region 305_C.

The mask patterns 340 may include mask circuit layout patterns 340c formed in the mask chip region 305_C, an alignment layout pattern 340a and a test layout pattern 340t formed in the mask scribe lane region 305_S, and a border mask pattern 340d formed in the border region 310. The mask patterns 340 may further include a guard ring layout pattern 340g disposed in the mask chip region 305_C adjacent to the mask scribe lane region 305_S.

As described above, in a lithography method using a multiscale simulation, through a multiscale simulation in which a quantum scale, a molecular scale, and a continuum scale are integrated, physical phenomena on a multilevel, such as acid activation, acid/base diffusion, an acid-base neutralization reaction and a change in concentration of acid caused by the neutralization reaction, deprotection, a change in solubility of a polymer chain, and control of acid diffusion by base in unexposed regions, may be simulated. Therefore, selection of a structure or a material composition of the resist to patterning of the resist (for example, resist manufacturing or selection→exposure→post-exposure bake (PEB)→developing) may all be performed together to significantly reduce development time and costs of lithography resist. In addition, the lithography method according to the present embodiment may overcome limitations of conventional single-scale simulations to significantly improve consistency for estimation of a resist pattern shape, as compared with the single scale simulations.

While example embodiments have been shown and described above, it will be apparent to those skilled in the art that modifications and variations could be made without departing from the scope of the present inventive concepts as defined by the appended claims.

What is claimed is:

1. A lithography method, the lithography method comprising:

estimating a shape of a virtual resist pattern for a selected resist based on a multiscale simulation;

forming a test resist pattern by performing an exposure process on a layer formed of the selected resist;

determining whether an error range between the test resist pattern and the virtual resist pattern is in an allowable range; and forming a resist pattern on a patterning object using the selected resist when the error range is in the allowable range, wherein the estimating the shape of the virtual resist pattern comprises selecting a material composition for the selected resist;

modeling a unit lattice cell of the selected resist using a molecular scale simulation;

calculating a dissociation energy curve of a photo-acid generator (PAG) for the material composition, a reaction rate constant of an acid-base neutralization reaction, and a reaction rate constant of deprotection of a molecular chain included in the material composition using a quantum scale simulation;

simulating the acid-base neutralization reaction, acid/base diffusion, and deprotection of the molecular chain using a continuum scale simulation;

calculating solubility of the molecular chain after the deprotection;

forming the virtual resist pattern by stabilizing a pattern formed after a soluble molecular chain is removed from the unit lattice cell;

estimating the shape of the virtual resist pattern; and calculating a numerical value for the shape of the virtual resist pattern.

2. The lithography method of claim 1, wherein the selecting of the material composition includes selecting at least one of a molecular weight of the molecular chain, a kind of protection group, a kind of the PAG, a mixing ratio of the PAG, a kind of quencher, or mixing ratio of the quencher.

3. The lithography method of claim 2, wherein the molecular scale simulation is a molecular dynamics (MD) simulation, and in the modeling of the unit lattice cell, the molecular chain, the PAG, and the quencher are mixed such that the unit lattice cell is modelled at a molecular level.

4. The lithography method of claim 2, wherein a dissociation reaction of the PAG is simulated using the dissociation energy curve, a neutralization reaction between an acid and the quencher is simulated using the reaction rate constant of the acid-base neutralization reaction, and an acid concentration profile, a quencher concentration profile, and position information of the protection group are obtained.

5. The lithography method of claim 2, wherein the quantum scale simulation is a density function theory (DFT) simulation, and in the calculating of the dissociation energy curve of the PAG the reaction rate constant of the acid-base neutralization reaction and the reaction rate constant of the deprotection are included, a dissociation energy curve of absorption of secondary electrons generated in an exposed region is calculated, and a molecular structure is stabilized to calculate the dissociation energy curved, the reaction rate constant of the acid-base neutralization reaction is calculated under an assumption that the same amount of acid and base are neutralized as soon as the acid and the base react with each other, and the reaction rate constant of the deprotection is calculated by applying energy and a vibrational frequency of main molecules to a transition state theory.

6. The lithography method of claim 5, wherein the dissociation energy curve is applied to a force field between PAG cations and anions in the exposed region of the lattice unit cell in the modeling of the unit lattice cell of the selected resist, and is reproduced as a dissociation reaction of the PAG in the exposed region.

7. The lithography method of claim 1, wherein the continuum scale simulation is a finite difference method (FDM) simulation, and in the simulating of the acid-base neutralization reaction, the acid/base diffusion, and the deprotection, an initial acid concentration and an initial quencher concentration on each node of a unit lattice cell are derived as a function based on a distance between a protection group and an anion of the PAG and a function based on a distance between the anion of the PAG and the quencher, respectively, interaction energy $E_{int}$, in accordance with a distance "r" between reactors of respective chemical reactions, is obtained through molecular dynamics calculation using the following equations 1 and 2, a local concentration of the acid "$f_{acid}(r)$" and a concentration of the quencher "$f_{quencher}(r)$" are represented as a difference "$\Delta E_{int}$" between Boltzmann activation energy in a chemical reaction and energy in a most stabilized structure and obtained by the following equations 3 and 4, $$E_{int,acid} = E_{all} - E_{PR} - E_{PAG} \qquad \text{Equation 1}$$

$$E_{int,quencher} = E_{all} - E_{PAG} - E_{quencher} \qquad \text{Equation 2}$$

$$f_{acid}(r) = \exp(\Delta E_{int,quencher}(r)/k_B T) \qquad \text{Equation 3}$$

$$f_{quencher}(r) = \exp(\Delta E_{int,quencher}(r)/k_B T) \qquad \text{Equation 4}$$

wherein $E_{all}$, $E_{PR}$, $E_{PAG}$, and $E_{quencher}$ respectively denote energies of an entire system, a polymer chain, a PAG, and a quencher, $k_B$ denotes a Boltzmann's constant, and T denotes temperature, and an initial acid concentration in an exposed region of the unit lattice cell and an initial quencher concentration over the exposed region and an unexposed region are quantified through the equations 1 to 4.

8. The lithography method of claim 7, wherein in the simulating of the acid-base neutralization reaction, the acid/base diffusion, and the deprotection the acid/base diffusion and the acid-base neutralization reaction are simulated through the following formulas 5 and 6, and the deprotection reaction between the protection group and the acid is simulated through the following formula 7, $$\frac{\partial}{\partial t}(A) = \nabla \cdot (D_A \nabla \cdot A) - k_{quen} AQ \qquad \text{Equation 5}$$

$$\frac{\partial}{\partial t}(Q) = \nabla \cdot (D_Q \nabla \cdot Q) - k_{quen} AQ \qquad \text{Equation 6}$$

$$\frac{\partial}{\partial t}(R) = -k_p A_{pro} R \qquad \text{Equation 7}$$

where A denotes an acid concentration, $D_A$ denotes a diffusion coefficient of acid, Q denotes a concentration of a quencher, $D_Q$ denotes a diffusion coefficient of the quencher, $k_{quen}$ denotes the reaction rate constant of the acid-base neutralization reaction, R denotes a protection ratio of a protection group, $k_p$ denotes the reaction rate constant of the deprotection, and $A_{pro}$ denotes a local acid concentration in the protection group, and time iteration is performed by applying a method and a boundary condition at which inflow and outflow of acid do not occur on the outermost surface of the unit lattice cell, and the protection ratio decreases from 1 to 0 during a deprotection reaction.

9. The lithography method of claim 1, wherein the calculating of the solubility of the molecular chain includes calculating solubility based on an arithmetic mean value of a protection ratio of a protection group incorporated in the molecular chain, and when the protection ratio of the molecular chain is less than or equal to a specific reference value, a developing solvent is set to be soluble.

10. The lithography method of claim 1, wherein the estimating of the shape of the virtual resist pattern and the calculating of the numerical value for the shape of the virtual resist pattern includes calculating at least one value of critical dimension (CD), line edge roughness (LER), line width roughness (LWR), or local CD uniformity (LCU) for the shape of the virtual resist pattern.

11. The lithography method of claim 1, wherein
the selected resist is an extreme ultraviolet (EUV) resist, and
the forming of the resist pattern on the patterning object comprises
coating a resist formed of the selected resist on the patterning object;
exposing the coated resist with EUV;
performing a post-exposure bake (PEB) process on the exposed resist; and
developing the baked resist.

12. A method of manufacturing a semiconductor device, the method comprising:
estimating a shape of a virtual resist pattern for a selected resist based on a multiscale simulation;
forming a test resist pattern by performing an exposure process on a layer formed of the selected resist;
determining whether an error range between the test resist pattern and the virtual resist pattern is in an allowable range;
forming a resist pattern on a patterning object using the selected resist pattern when the error range between the test resist pattern and the virtual resist pattern is in the allowable range;
forming a pattern by etching the patterning object using the resist pattern as an etching mask; and
performing a subsequent semiconductor process after the pattern is formed,
wherein the estimating the shape of the virtual resist pattern comprises
selecting a material composition for the selected resist;
modeling a unit lattice cell of the selected resist using a molecular scale simulation;
calculating a dissociation energy curve of a photo-acid generator (PAG) for the material composition, a reaction rate constant of an acid-base neutralization reaction, and a reaction rate constant of deprotection of a molecular chain included in the material composition using a quantum scale simulation;
simulating an acid-base neutralization reaction, acid/base diffusion, and deprotection of the molecular chain using a continuum scale simulation;
calculating solubility of the molecular chain after the deprotection;
forming the virtual resist pattern by stabilizing a pattern, formed after a soluble molecular chain is removed from the unit lattice cell;
estimating the shape of the virtual resist pattern; and
calculating a numerical value for the shape of the virtual resist pattern.

13. The method of claim 12, wherein the modeling of the unit lattice cell including modeling based on a system including at least three components.

14. The method of claim 12, wherein
the molecular scale simulation is a molecular dynamics (MD) simulation, and
in the modeling of the unit lattice cell, a molecular weight of the molecular chain, a kind of protection group, a kind of the PAG, a mixing ratio of the PAG, a kind of quencher, a mixing ratio of the quencher are selected, and
the molecular chain, the PAG, and the quencher are mixed such that the unit lattice cell is modelled at a molecular level.

15. The method of claim 14, wherein
the quantum scale simulation is a density function theory (DFT) simulation, and
in the calculating of the dissociation energy curve of the PAG
the reaction rate constant of the acid-base neutralization reaction, and the reaction rate constant of the deprotection are included,
a dissociation energy curve of absorption of secondary electrons generated in an exposed region is calculated, and a molecular structure is stabilized to calculate the dissociation energy curved,
the reaction rate constant of the acid-base neutralization reaction is calculated under an assumption that the same amount of acid and base are neutralized as soon as the acid and the base react with each other, and
the reaction rate constant of the deprotection is calculated by applying energy and a vibrational frequency of main molecules to a transition state theory.

16. The method of claim 12, wherein
the selected resist is an EUV resist,
the molecular scale simulation is a molecular dynamics (MD) simulation,
the quantum scale simulation is a density function theory (DFT) simulation,
the continuum scale simulation is a finite difference method (FDM) simulation, and
in the estimating of the shape of the virtual resist pattern and the calculating of the numerical value for the shape of the virtual resist pattern, at least one value of critical dimension (CD), line edge roughness (LER), line width roughness (LWR), or local CD uniformity (LCU) is calculated for the shape of the virtual resist pattern to quantify patterning performing of a selected material composition.

17. The method of claim 12, wherein the forming of the resist pattern on the patterning object comprises:
coating a resist formed of the selected resist on the patterning object;
exposing the coated resist with EUV;
performing a post-exposure bake (PEB) process on the exposed resist; and
developing the baked resist.

18. Exposure equipment comprising:
a simulation device including processing circuitry configured to estimate a shape of a virtual resist pattern of a selected resist by
performing a quantum scale simulation based on a dissociation energy curve of a photo-acid generator (PAG) of the selected resist, a reaction rate constant of an acid-base neutralization reaction of the selected resist, and a reaction rate constant of deprotection of a molecular chain included in the selected resist, performing a molecular scale simulation based on a unit lattice cell of the selected resist, the unit lattice modeled, at a molecular level, based on a mixture including a molecular chain, the PAG, and a quencher, and performing a continuum scale simulation of an acid-base neutralization reaction, acid/base diffusion, and deprotection reaction;

an exposure device configured to perform an exposure process to form a test resist pattern based on a result from the simulation device; and a measurement device configured to measure the test resist pattern and to compare the test resist pattern with the virtual resist pattern.

19. The exposure equipment of claim 18, wherein the simulation device simulates PAG dissociation, acid activation, the acid-base neutralization reaction, the acid/base diffusion, and the deprotection reaction in the unit lattice cell of the resist.

20. The exposure equipment of claim 18, wherein processing circuitry is further configured to estimate the shape of the virtual resist pattern.

* * * * *